US009536626B2

(12) United States Patent
Schoenborn et al.

(10) Patent No.: US 9,536,626 B2
(45) Date of Patent: Jan. 3, 2017

(54) MEMORY SUBSYSTEM I/O PERFORMANCE BASED ON IN-SYSTEM EMPIRICAL TESTING

(71) Applicants: Theodore Z. Schoenborn, Portland, OR (US); Christopher P. Mozak, Beaverton, OR (US)

(72) Inventors: Theodore Z. Schoenborn, Portland, OR (US); Christopher P. Mozak, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 791 days.

(21) Appl. No.: 13/763,511

(22) Filed: Feb. 8, 2013

(65) Prior Publication Data
US 2014/0229666 A1    Aug. 14, 2014

(51) Int. Cl.
G11C 29/06    (2006.01)
G11C 29/56    (2006.01)
G11C 29/04    (2006.01)

(52) U.S. Cl.
CPC ............... *G11C 29/06* (2013.01); *G11C 29/56* (2013.01); *G11C 2029/0401* (2013.01)

(58) Field of Classification Search
None
See application file for complete search history.

(56) References Cited

U.S. PATENT DOCUMENTS

| 4,491,930 | A | * | 1/1985 | Hyatt | 708/3 |
| 5,548,539 | A | * | 8/1996 | Vlach | G05B 17/02 703/13 |
| 6,522,174 | B2 | | 2/2003 | Martin et al. | |
| 6,774,678 | B2 | | 8/2004 | Martin et al. | |
| 6,825,693 | B2 | | 11/2004 | Schoenborn et al. | |
| 6,847,617 | B2 | | 1/2005 | Borkar et al. | |
| 6,894,536 | B2 | | 5/2005 | Martin et al. | |
| 7,155,006 | B2 | | 12/2006 | Casper et al. | |
| 7,206,981 | B2 | | 4/2007 | Schoenborn et al. | |

(Continued)

FOREIGN PATENT DOCUMENTS

WO    WO-2011067795 A1    6/2011

OTHER PUBLICATIONS

Kin, Kenrick, Maneesh Agrawala, and Tony DeRose. "Determining the benefits of direct-touch, bimanual, and multifinger input on a multitouch workstation." Proceedings of Graphics interface 2009. Canadian Information Processing Society, 2009.*

(Continued)

*Primary Examiner* — Charles Rones
*Assistant Examiner* — Hewy Li
(74) *Attorney, Agent, or Firm* — Blakely, Sokoloff, Taylor & Zafman LLP

(57) ABSTRACT

A memory subsystem empirically tests performance parameters of I/O with a memory device. Based on the empirical testing, the memory subsystem can set the performance parameters specific to the system in which the memory subsystem is included. A test system performs the testing. For each of multiple different settings for multiple different I/O circuit parameters, the test system sets a value for each I/O circuit parameter, generates test traffic to stress test the memory device with the parameter value(s), and measures an operating margin for the I/O performance characteristic. The test system further executes a search function to determine values for each I/O circuit parameter at which the operating margin meets a minimum threshold and performance of at least one of the I/O circuit parameters is increased. The memory subsystem sets runtime values for the I/O circuit parameters based on the search function.

23 Claims, 10 Drawing Sheets

(56) References Cited

U.S. PATENT DOCUMENTS

| | | | |
|---|---|---|---|
| 7,209,907 B2 | 4/2007 | Cherukuri et al. | |
| 7,272,707 B2 * | 9/2007 | Liu et al. | 713/1 |
| 7,324,458 B2 | 1/2008 | Schoenborn et al. | |
| 7,328,359 B2 | 2/2008 | Frodsham et al. | |
| 7,444,558 B2 | 10/2008 | Mitbander et al. | |
| 7,464,307 B2 | 12/2008 | Nejedlo et al. | |
| 7,617,424 B2 | 11/2009 | Frodsham et al. | |
| 7,624,225 B2 | 11/2009 | Gower et al. | |
| 7,627,730 B1 * | 12/2009 | Moll | G06F 13/161 710/100 |
| 7,647,467 B1 * | 1/2010 | Hutsell et al. | 711/170 |
| 7,711,878 B2 | 5/2010 | Cherukuri et al. | |
| 7,804,890 B2 | 9/2010 | Navada et al. | |
| 7,844,767 B2 | 11/2010 | Cherukuri et al. | |
| 7,886,174 B2 | 2/2011 | Spry et al. | |
| 7,898,295 B1 | 3/2011 | Kasturirangan et al. | |
| 7,936,684 B2 | 5/2011 | Schoenborn et al. | |
| 7,979,039 B2 | 7/2011 | Sumesaglam et al. | |
| 8,045,663 B2 | 10/2011 | Bae et al. | |
| 8,195,996 B2 | 6/2012 | Frodsham et al. | |
| 8,331,176 B2 | 12/2012 | Mozak et al. | |
| 8,335,894 B1 * | 12/2012 | Rajan et al. | 711/154 |
| 8,819,474 B2 | 8/2014 | Schoenborn et al. | |
| 8,868,992 B2 | 10/2014 | Spry et al. | |
| 8,996,934 B2 | 3/2015 | Mozak et al. | |
| 9,003,246 B2 | 4/2015 | Mozak et al. | |
| 9,009,531 B2 | 4/2015 | Mozak et al. | |
| 9,009,540 B2 | 4/2015 | Mozak et al. | |
| 2004/0233706 A1 | 11/2004 | Burgan | |
| 2005/0068829 A1 | 3/2005 | Oh | |
| 2005/0262184 A1 | 11/2005 | Cherukuri et al. | |
| 2007/0030746 A1 | 2/2007 | Best et al. | |
| 2007/0088520 A1 | 4/2007 | Hagerott et al. | |
| 2008/0130811 A1 | 6/2008 | Bae et al. | |
| 2008/0235444 A1 | 9/2008 | Gower et al. | |
| 2009/0115448 A1 | 5/2009 | Abadeer et al. | |
| 2010/0127736 A1 | 5/2010 | Dixit et al. | |
| 2011/0022870 A1 * | 1/2011 | McGrane et al. | 713/340 |
| 2011/0141827 A1 * | 6/2011 | Mozak | G11O 5/147 365/189.09 |
| 2012/0144106 A1 | 6/2012 | Bains | |
| 2012/0243364 A1 | 9/2012 | Hacking | |
| 2013/0058145 A1 | 3/2013 | Yu et al. | |
| 2013/0173970 A1 | 7/2013 | Kleveland et al. | |
| 2013/0313709 A1 | 11/2013 | Hinck et al. | |
| 2014/0095946 A1 | 4/2014 | Mozak et al. | |
| 2014/0095947 A1 | 4/2014 | Mozak et al. | |
| 2014/0157053 A1 | 6/2014 | Mozak et al. | |
| 2014/0157055 A1 | 6/2014 | Mozak et al. | |
| 2014/0157065 A1 | 6/2014 | Ong | |
| 2014/0184523 A1 | 7/2014 | McCall et al. | |
| 2014/0189293 A1 | 7/2014 | Gopal et al. | |

OTHER PUBLICATIONS

Corrigan, Steve. "Skew definition and jitter analysis." Published Feb. 2000. Analog Applications Journal. <http://www.ti.com/lit/an/slyt179/slyt179.pdf>.*

PCT International Search Report and Written Opinion of the International Searching Authority for Int'l Application No. PCT/US2013/047421, dated Oct. 15, 2013, 9 pages.

Notice of Allowance in related U.S. Appl. No. 13/730,429, mailed Jul. 8, 2015, 6 pages.

* cited by examiner

MEMORY SUBSYSTEM I/O PERFORMANCE BASED ON IN-SYSTEM EMPIRICAL TESTING

FIELD

Embodiments of the invention are generally related to memory subsystems, and more particularly to operating a specific system at higher I/O performance based on empirical testing.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2012, Intel Corporation, All Rights Reserved.

BACKGROUND

Memory devices find ubiquitous use in electronic devices, such as in consumer electronics. Memory devices are typically used to store executable code and data for the runtime operation of the electronic device. While better performance at lower power is a constant pursuit of newer memory devices and memory subsystems, there is typically a tradeoff between performance, power, and cost. There are many performance settings and factors that contribute to both the performance and power consumption of memory devices, and it may not be possible to provide general settings to achieve both across commodity devices (i.e., generally available, high volume memory devices used in most consumer electronics). Memory devices are tested to determine if they will perform according to design expectations to handle the stresses of runtime operation, and if they achieve acceptable performance at generic settings. Even if they achieve acceptable performance, standard settings may not provide the best performance solution for a specific system.

Communication between memory devices and other components (e.g., the memory controller, a processor) on the host platform has several performance characteristics of interest. In general, the communication with the memory device can be referred to as I/O (input/output), and is governed by standards at least for performance characteristics related to I/O power, I/O latency, and I/O frequency. The different performance characteristics can sometimes have conflicting objectives. For example, the I/O with a memory device could be performed at a higher frequency, which would typically increase the power consumption. Thus, increasing performance for one characteristic frequently has a negative impact on at least one other characteristic. Additionally, the standards or nominal values of I/O performance settings are set to values that can be achieved across different systems.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
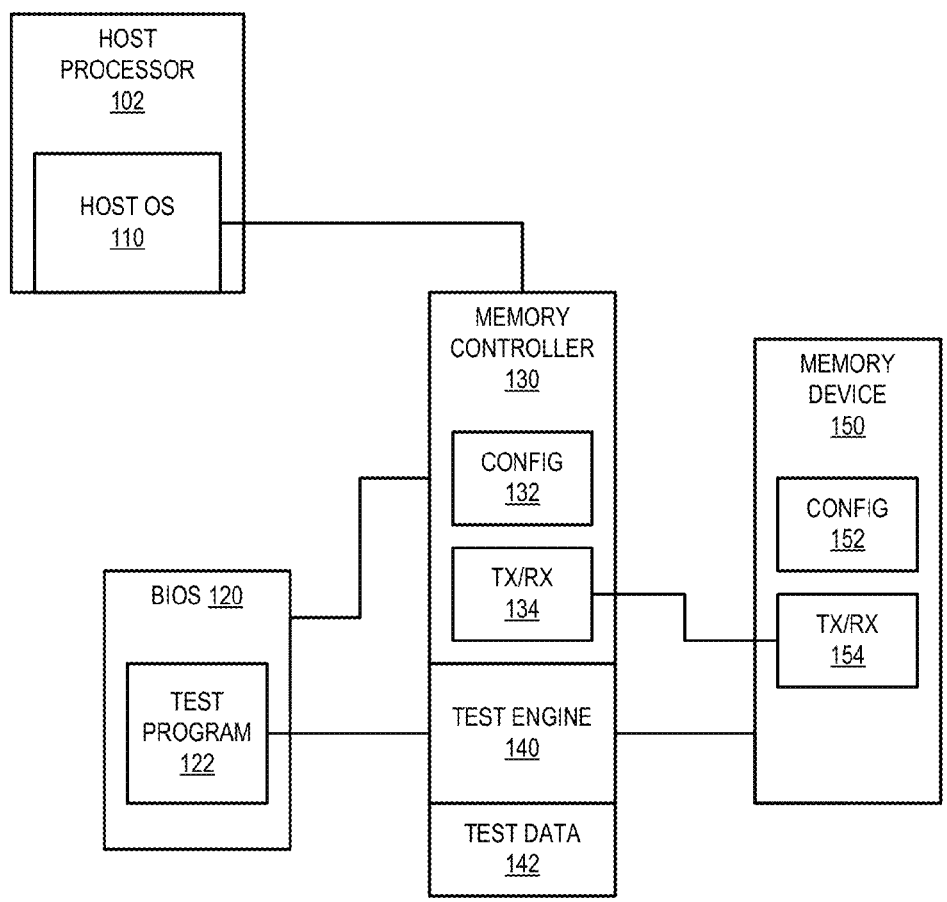
FIG. 1 is a block diagram of an embodiment of a system having a test engine that provides testing in-system.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory subsystem empirically tests performance parameters of memory device I/O (input/output) for a specific device. Based on the empirical testing via a test system, the memory subsystem can set the performance parameters specific to the system or device in which the memory subsystem is included. For each of multiple different settings for multiple different I/O circuit parameters, the test system sets a value for each I/O circuit parameter, generates test traffic to stress test the memory device with the parameter value(s), and measures an operating margin for the I/O performance characteristic. The test system further executes a search function to determine values for each I/O circuit parameter at which the operating margin meets a minimum threshold and performance of at least one of the I/O circuit parameters is increased. The memory subsystem sets runtime values for the I/O circuit parameters based on the search function.

With the specific testing and search function, a test system can empirically test for which settings provide a performance benefit for one performance characteristic while still maintaining compliance with standard for other performance characteristics. Thus, for example, a test system can balance tradeoffs for I/O power, I/O latency, and I/O frequency. Each performance characteristic can have potentially multiple parameters or settings that directly and/or indirectly affect specific performance characteristics. Currently, all parameters that affect memory device I/O performance are determined by memory device manufacturers, OEMs (original equipment manufacturers), or others to ensure functionality at a particular data protection management (DPM) level for all systems including the worst case system. The settings that affect I/O power, I/O latency, and I/O frequency are not changed for specific systems. As described herein, the settings can be dynamically changed for specific components of specific systems based on testing.

I/O power makes up a significant amount of power consumption in many electronic devices. Currently, the I/O power performance is governed by fixed value settings that ensure functionality at a particular DPM level, but do not achieve the lowest possible operating I/O power for an individual device. In one embodiment, as described herein, the test system empirically tests and determines settings that can lower an operating I/O power in the host platform without using any host or test equipment attached. The lower operating I/O power maintains DPM requirements for the product or device under test.

I/O latency affects how long it takes to access a memory device for an access transaction. Lower I/O latency can result in faster access, and thus increased performance in the system due to obtaining data faster. Most parameters that affect I/O latency are currently set within products by using fixed values that ensure functionality at a particular DPM level but do not achieve the lowest possible operating I/O latency for an individual device. In one embodiment, as described herein, the test system empirically tests and determines settings that can lower an operating I/O latency in the host platform without using any host or test equipment attached. The lower operating I/O latency maintains DPM requirements for the product or device under test. As used here, latency is a generic term that could refer to latency to write data to memory, latency to return read data from memory, or the time required to wait (latency) to turn around the bus from one data access to another data access.

I/O frequency affects how long it takes to access a memory device for an access transaction. Higher I/O frequency can result in higher bandwidth, and thus increased performance in the system due to obtaining data faster. Higher bandwidth allows more operations in a given period of time, which can allow a data limited system to operate at higher performance. It can also reduce power by decreasing the amount of time the I/O is active, and increasing the amount of time the I/O is in a low power state. I/O frequency is currently set within products by using fixed values that ensure functionality at a particular DPM level but do not achieve the highest possible operating I/O frequency for an individual device. In one embodiment, as described herein, the test system empirically tests and determines settings that can lower an operating I/O latency in the host platform without using any host or test equipment attached. The lower operating I/O latency maintains DPM requirements for the product or device under test. Regarding the testing, the test engine produces test content to exercise both I/O content and device specific content. The I/O content can be used to stress the I/O link for maximum frequency. The device specific content can be used to stress internal speed paths in the device that limit maximum frequency. Thus, a portion of the test content can be generic to I/O interfaces, while at least a portion of the test content can be specific to an architecture of the device under test.

For any target I/O performance characteristic (e.g., I/O power, I/O latency, I/O frequency), the test system can adjust any number of I/O circuit parameters that affect the target performance characteristic. The test system can adjust the frequency, for example, by using a fractional-N divider in a PLL (phase locked loop) circuit, which can adjust the frequency only for the memory subsystem, instead of for the computing device as a whole. Other methods to adjust the memory subsystem frequency will also be understood by those skilled in the art of overclocking systems. The test system then measures one or more operating margins (e.g., timing, maximum frequency, and/or voltage) across each setting. The test system performs a search based on the measured values to identify settings that maintain minimum requirements (e.g., settings that allow the device to satisfy DPM requirements), while improving performance of the target performance characteristic. The operations of the test system could be said to "optimize" the system. It will be understood that "optimize" does not necessarily refer to an absolute best performance possible. Optimizing can refer instead to improving or maximizing performance with respect to certain conditions, or in specific circumstances, or within certain constraints.

The testing provides stress on the memory device from the perspective of one or more performance parameters of interest, as provided by the examples above. It will be understood that other performance parameters could be evaluated by a test system. From one perspective, the memory device and memory subsystem are specifically tested in-system to determine whether the subsystem can be operated beyond the specification or standard applicable to the memory subsystem and memory device with respect to the I/O. The memory devices and subsystems described herein are presumed to pass specification, and as such comply with a standard or a specification that applies to the memory device I/O with respect to timing parameters, voltages, power, and other operating parameters. Thus, based on what is described herein, a commodity device can be made to operate at a higher performance than the performance for which it is rated. The testing can be performed based only on the system itself, without the need for outside test equipment.

Regarding the testing, a test system as referred to herein includes hardware elements located in and/or near the memory controller (e.g., on a shared die space, on a SoC (system on a chip)). The test system can create precise combinations of I/O (input/output) that result in I/O-induced power supply noise, inter-symbol interference (ISI), signal crosstalk, and/or other conditions. Any of these effects can be created by precisely controlling the data on each I/O lane, the pattern on each command lane, and/or how the data signals align with each other across lanes. Additionally, the test system can monitor the performance of the memory devices when refresh rates or other operating parameters of the system are adjusted.

In one embodiment, the test system is configured to create any of a variety of test pattern signal conditions, which enables the test system to create the desired effects to test the memory subsystem. Such pattern signal conditions can include: pseudo random patterns on all lanes, walking one patterns, walking zero patterns, row stripes, column strips, checkerboards, and/or others; applying one pattern to a victim lane while adjacent aggressor lanes get a different pattern, which can further include rotating the victim lane; driving a single frequency tone pattern to excite resonances; combinations of resonance patterns and pseudo random patterns to simultaneously create supply noise and ISI/crosstalk; fixed-pattern hardware training modes (e.g., providing a fixed 1010 pattern for read training), and/or others. In one embodiment, the test system can generate a fixed pattern that allows software to control the values on every lane (e.g., data lane or command lane) in every cycle independently to find a worst case pattern via advanced search techniques. In addition to the ability to generate each of the pattern conditions mentioned, the test system sits close to the memory controller scheduler, which enables the test system to generate all of the pattern types at high speed in hardware.

In one embodiment, a test engine is located prior to the memory controller in the data/request path to test data and commands by injecting memory access transactions into the memory controller. In one embodiment, a test engine or part of a test engine is part of the memory controller itself, and sits prior to the scheduler. Thus, the test system can provide data to be scheduled by the scheduler of the memory controller. As a result, any test traffic is sent to the memory device in a way compliant with memory device access protocol. Thus, errors in the reading back should indicate actual errors in the memory subsystem.

In one embodiment, the test system generation is performed by leveraging a write data buffer or comparable structure on or near the memory controller. Description herein is made in reference to a write data buffer, but such descriptions will be understood to apply equally to a comparable array structure where rows and columns of bits can be selected to generate patterns as described herein. In one embodiment, the write data buffer or comparable structure acts as a lookup table to generate Boolean functions of the select lines of the array. In one embodiment, the pattern generation includes incrementing through lines of the buffer array to allow for multiple stress patterns. In one embodiment, the test system includes logic to save and/or restore state from a pattern selection generator (PatternSelGen).

In general, memory access transactions referred to herein indicate to the memory controller what to do, but not how to do it. The memory controller controls tracking the current state of memory and how to access a location based on the current state of memory. Thus, the memory controller determines how to Activate and/or Precharge the proper pages, issue appropriate CAS/RAS commands, obey all relevant timing related to accessing the memory device, and otherwise comply with memory device access protocols.

The test engine as described herein can be used to test memory devices. Any memory subsystem that uses a memory controller with a scheduler or equivalent logic can implement at least one embodiment of the test engine. Reference made herein to memory devices can include different memory types. For example, memory subsystems commonly use DRAM, which is one example of a memory device as described herein. Thus, the test engine described herein is compatible with any of a number of memory technologies, such as DDR4 (dual data rate version 4, specification in development as of the filing of this application), LPDDR4 (low power dual data rate version 4, specification in development as of the filing of this application), WIDEIO (specification in development as of the filing of this application), and others.

FIG. 1 is a block diagram of an embodiment of a system having a test engine that provides testing in-system. System 100 includes a memory subsystem including memory controller 130 and memory device 150. System 100 represents a production system, or a system in which memory device 150 is placed to be used by a consumer. System 100 includes a hardware platform (not explicitly shown) on which host processor 102 resides, as well as the memory subsystem including memory controller 130 and memory device 150. BIOS (basic input/output system) 120 or equivalent firmware for initializing the system, including the memory subsystem, also resides on the hardware platform.

Host processor 102 executes, among other things, host operating system (OS) 110. Host OS 110 generally provides operational control of system 100 during runtime. Host OS 110 provides software to hardware and hardware to software interfaces to allow a user to interact with system 100. BIOS 120 provides start-up control over system 100 until host OS 110 is loaded.

Host OS 110 provides memory access requests to memory controller 130 for access to memory device 150 for read and/or write of data. Similarly, BIOS 120 can provide memory access requests to memory controller 130. Memory controller 130 accesses memory device 150 in response to data access requests. In one embodiment, test engine 140 generates data access requests and/or access transactions for memory controller 130 to send to memory device 150. In one embodiment, test engine 140 can directly provide test data to memory device 150.

In one embodiment, BIOS 120 initiates a test via test program 122, and accesses test engine 140 to generate test data 142 to test memory device 150, either directly or via memory controller 130. In one embodiment, test data 142 represents data stored during monitoring of testing memory device 150, such as data that is used to identify performance of memory device 150 under different parameter settings. In response to identifying the performance of the memory device, system 100 can dynamically set the operating parameters for I/O with memory device 150. Dynamically setting the operating parameters allows the system to set performance in accordance with a specific device, rather than using standard or default settings generally applicable to all devices. In this way, a specific system is not limited to the performance of the worst case possible system.

In one embodiment, configuration 152 represents a mechanism within memory device 150 such as a register or other configuration mechanism that stores I/O settings for TX/RX 154. TX/RX 154 represents transmit and receive circuits of memory device 150 that control the I/O performance of memory device 150. In one embodiment, configuration 132 represents a mechanism at memory controller 130 that stores I/O settings for TX/RX 134. TX/RX 134 represents transmit and receive circuits of memory controller 130 that control the I/O performance to memory device 150. It will be understood that other components can also be connected to memory device 150 via TX/RX circuits, and would have similar configuration mechanisms.

Figure 2:
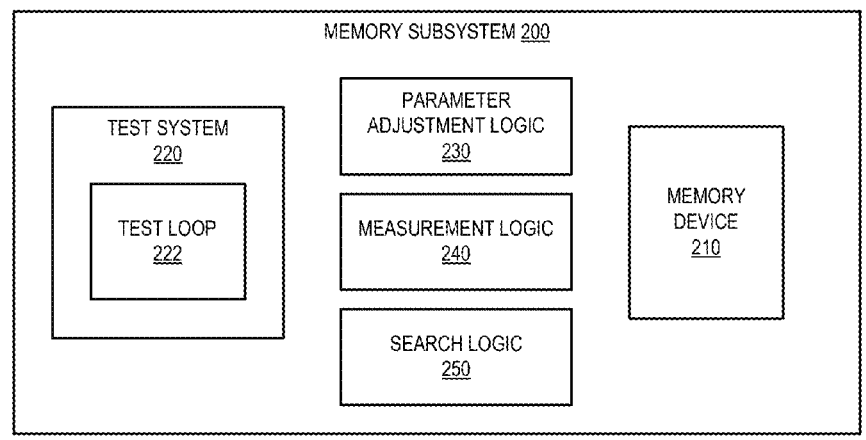
FIG. 2 is a block diagram of an embodiment of a memory subsystem having a test system that provides testing in-system.

FIG. 2 is a block diagram of an embodiment of a memory subsystem having a test system that provides testing in-system. Memory subsystem 200 provides one example embodiment of a memory subsystem in accordance with system 100. Elements of memory subsystem 200 can include memory device 210, test system 220, parameter adjustment logic 230, measurement logic 240, and search logic 250.

Memory device 210 represents one or more devices in the memory subsystem. Test system 220 provides testing of memory device 210 to determine how to set I/O operating parameters with respect to communicating with memory device 210. In one embodiment, test system 220 includes test loop 222, which represents a loop to perform during the testing. In particular, in one embodiment, testing and measurement are performed iteratively in loop 222 to determine how memory device 210 performs under a variety of conditions. In one embodiment, test system 220 includes extrapolation logic, which can be used to extrapolate performance (e.g., worst-case performance) of the memory device based on a number of measurements for different parameter settings. In one embodiment, test system 220 includes correlation logic, which can be used to correlate multiple test results with each other to reduce or compensate for noise in the test results.

Parameter adjustment logic 230 represents logic to change a performance parameter. In one embodiment, logic 230 represents logic that adjusts a VDD or other voltage reference to memory device 210. Such logic can include a variable high reference voltage circuit that provides a variable voltage to the memory device in response to control logic. In one embodiment, logic 230 represents logic that adjusts one or more latency parameters. For example, logic 230 could adjust latency parameters related to delays (or guard bands) between an Activate command and a column address strobe/signal (CAS), between a Precharge command and an Activate command, between an Activate command and a Read or Write command, between a Read command and data availability, between a Read command and a Precharge command, and/or others. In one embodiment, logic 230 represents logic that adjusts one or more frequency parameters. For example, logic 230 could adjust parameters related to any of the latency parameters above or other timing parameters, turnaround time, or other I/O parameters.

In one embodiment, parameter adjustment logic 230 is part of a memory controller, and affects configuration settings within the memory controller that control the delays. In one embodiment, logic 230 exists outside the memory controller, such as in a test engine close to the memory controller. In one embodiment, logic 230 causes the memory controller to adjust settings in the memory device itself, such as by setting configuration options. In one embodiment, parameter adjustment logic 230 can adjust the frequency at which the memory subsystem runs with fine granularity step size. Test system 220 determines operating settings specific to memory subsystem 200 based on the testing.

Measurement logic 240 represents logic that measures one or more indicators of performance. For example, logic 240 can measure a signal eye width, a signal eye height, or both. In one embodiment, logic 240 measures a two dimensional version of eye height/eye width by measuring at angles other than 0 or 90 degrees. In one embodiment, logic 240 measures power consumption by memory subsystem 200. It will be understood that settings are adjusted by parameter adjustment logic 230 in accordance with the granularity of measurement of measurement logic 240 (i.e., change a parameter setting enough to make a detectable difference). Search logic 250 represents logic that determines from measured values what settings to use for I/O with memory device 210. In one embodiment, measurement logic 240 is used to generate one or more representative performance curves for the specific memory subsystem 200 under test. Based on the representative curves, search logic 250 can perform a search function to determine what settings to use to satisfy better performance for at least one parameter, while at least maintaining required (by standard or configuration) performance for the others. Search logic 250 can include any of n-dimensional search logic, 1-dimensional search logic (to perform n 1-dimensional searches), linear fit search logic, quadratic fit search logic, steepest descent search logic, curve fitting search logic, or others. It will be understood that n represents an integer indicating the number of combinations to search. Search logic 250 can also combine multiple measurements together to either reduce repeatability noise or extrapolate to worst case conditions. In one embodiment, an administrator can determine which consideration (I/O power, I/O frequency, or I/O latency) is the most significant characteristic for a system deployment of memory subsystem 200 and run test operations to improve that particular target characteristic.

Figure 3:
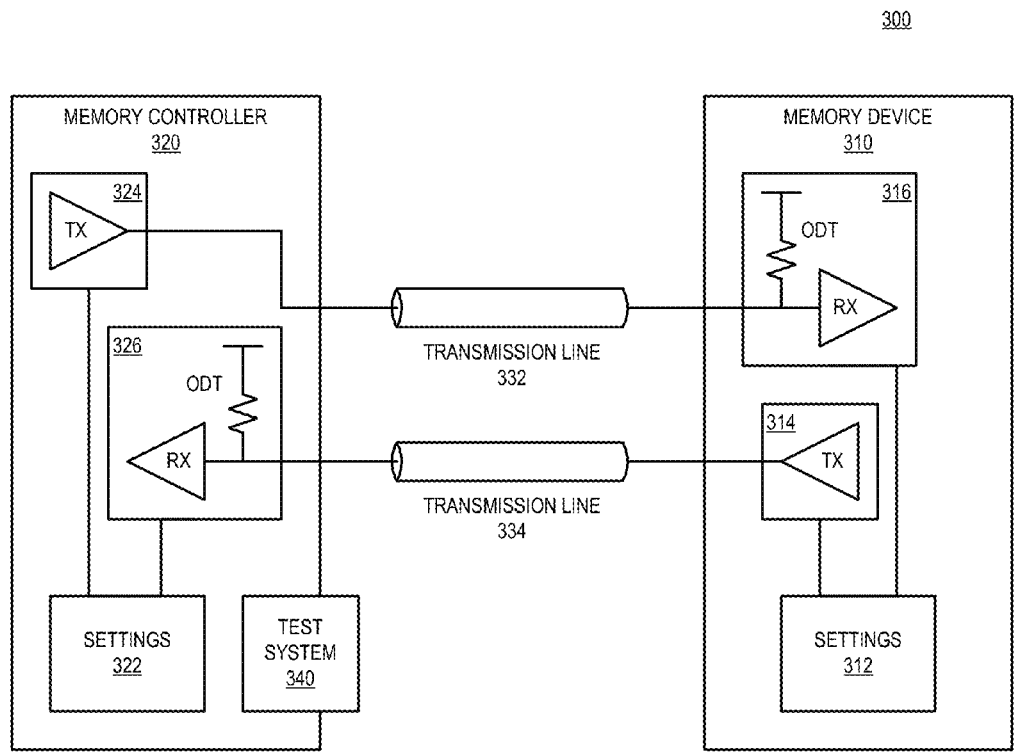
FIG. 3 is a block diagram of an embodiment of a memory controller and memory device communication subsystems.

FIG. 3 is a block diagram of an embodiment of a memory controller and memory device communication subsystems. System 300 includes memory device 310 and memory controller 320. It will be understood that for I/O with memory device 310, the memory device includes receiver 316 and transmitter 314. Memory controller 320 likewise includes transmitter 324 that couples to receiver 316, and receiver 326 that couples to transmitter 314. Transmitter 324 couples to receiver 316 via transmission line 332, and transmitter 314 couples to receiver 326 via transmission line 334. In one embodiment, transmission lines 332 and 334 are signal lines (e.g., traces) connecting I/O pins of memory device 310 and memory controller 320.

In I/O system 300, memory device 310 includes settings 312 to control the settings for the transmit and receive functions. Similarly, memory controller 320 includes settings 322 to control the settings for the transmit and receive functions of the memory controller. For example, various settings can be applied to control timing, power, output voltage levels, output impedance, slew rate, or other transmit parameters. On the receive side, on die termination (ODT), amplifier gain, equalization, and other receiver parameters can be controlled via various settings. As described herein, test system 340 performs tests at various different settings of the transmit and receive parameters, makes measurements, determines operating margins for the system (e.g., how the system is to required minimum performance). The operating margins can be determined, for example, by having a minimum threshold (which in one embodiment includes a guard band) for various performance characteristics. Thus, determining operating margins can include determining actual performance compared to the thresholds. The thresholds can be dynamically calculated based on multiple measurements at different operating voltages, temperatures, or test, and extrapolated to worst case conditions. Additionally, one or more thresholds can be different for each of the different operating margins that are tested.

While it is understood that both memory device 310 and memory controller 320 include transmit and receive hardware, for purposes of discussion herein, the "transmit side" or "transmitter side" refer to the memory controller or equivalent. Thus, the systems are described herein with reference to the host system, which includes a memory controller or equivalent to interface with the memory device. Thus, it will be understood that the "receive side" or "receiver side" refers to the memory device unless otherwise stated. On the transmitter side, in one embodiment, the physical characteristics most closely measured and controlled include Ron (effective output resistance from the transmitter), slew rate, equalization (EQ) (e.g., value of an equalization stage), and crosstalk cancellation. On the receiver side, in one embodiment, the physical characteristics most closely measured and controlled include Rodt (on die termination resistance, or the receiver input impedance), EQ, deskew (which can be applied on a per lane basis), and input gain that controls power versus bandwidth.

As mentioned above, typically a system is configured to monitor and control one performance characteristic. For example, system 300 (including test system 340) can be configured to improve performance by one of: reducing I/O power, increasing I/O frequency, or reducing I/O latency. Each performance characteristic is briefly discussed in turn.

In one embodiment, system 300 is configured to reduce I/O power, in which case settings 312 and 322 include at least the ability to change I/O circuit parameters that affect I/O power usage. Examples of the parameters include but are not limited to termination values, bias, slew rate, driver swing, driver impedance, and operating voltage. In such an embodiment, test system 340 generates test content that stimulates the I/O with something having a known correlation to the worst case stimulus. Test system 340 measures the operating voltage and/or timing margin for various circuit settings. Test system 340 then analyzes the measured circuit parameter margin data (e.g., via a search function as described herein) and determines a lowest operating I/O power that still maintains the stated product DPM requirements for the parameters and settings tested and measured.

In one embodiment, system 300 is configured to increase I/O frequency, in which case settings 312 and 322 include at least the ability to change I/O circuit parameters that affect I/O frequency. Examples of the parameters include but are not limited to termination values, bias, slew rate, current mode drivers, and operating voltage. Frequency parameters can be affected by components that can include but are not limited to DLLs (delay locked loops), PLLs (phase locked loops), and/or clock chips. In such an embodiment, test system 340 generates test content that stimulates the I/O with something having a known correlation to the worst case stimulus. Test system 340 measures the operating voltage, operating frequency, and/or timing margin for various circuit settings. Test system 340 then analyzes the measured circuit parameter margin data (e.g., via a search function as described herein) and determines a highest operating I/O frequency that still maintains the stated product DPM requirements for the parameters and settings tested and measured.

In one embodiment, system 300 is configured to reduce I/O latency, in which case settings 312 and 322 include at least the ability to change I/O circuit parameters that affect I/O latency. Examples of the parameters include but are not limited to turnaround values, FIFO (first-in, first-out buffer) pointers, round trip latency counters, termination values, bias, slew rate, and/or current mode drivers. In such an embodiment, test system 340 generates test content that stimulates the I/O with something having a known correlation to the worst case stimulus. Test system 340 measures the operating voltage and/or timing margin for various circuit settings. Test system 340 then analyzes the measured circuit parameter margin data (e.g., via a search function as described herein) and determines a lowest operating I/O latency that still maintains the stated product DPM requirements for the parameters and settings tested and measured.

In one embodiment, turnaround is dependent on ODT timing. Thus, adjusting the parameters can include timing parameters instead of simply a value of a component. The ODT timing refers to when ODT is turned on or off to perform a read or write operation. Thus, there is an interoperation between parameter value settings and settings related to the timing of operations and interaction among the components. In general, turnaround time is related to latency. A read operation cannot be properly performed until the previous access operation is completed, or both operations could both be compromised. The test system can reduce the time it takes before starting a read to get a better turnaround time. The turnaround time can be reduced by reducing the time the ODT is turned on before data is transmitted, or reducing the time it is turned off after data is transmitted.

It will be understood that historically many or all of the operating parameters are set to static values for operation. In contrast, as described herein, test system 340 tests and measures for parameter settings that increase performance of system 300. Test system 340 performs a search function, which can include any one or more of many known search techniques. For example, quadratic fit, linear fit, n-dimensional search, n 1-dimensional searches, genetic search, steepest descent, curve fitting, or other techniques, or some combination can be used. The dimensions of the search depend on the manipulation of the settings of the parameters. In one embodiment, the n dimensions of the search include N parameters that affect both transmit and receive operation. In on embodiment, the n dimensions includes X transmit parameters by Y receiver parameters, where N is equal to the combination of unique X and Y parameters to test. Test system 340 can run a test, measure the operating margin, test reliability, adjust the parameters, and repeat.

In one embodiment, the testing and setting parameters specific to a system can increase the performance of a device that already passes threshold specification requirements. In another embodiment, the testing can be used to increase overall system yield, by bringing into compliance systems that as originally manufactured did not pass the threshold specification requirements. Thus, manufacturing processes could be made to tolerate a wider variation of components and systems due to testing and correcting.

Figure 4:
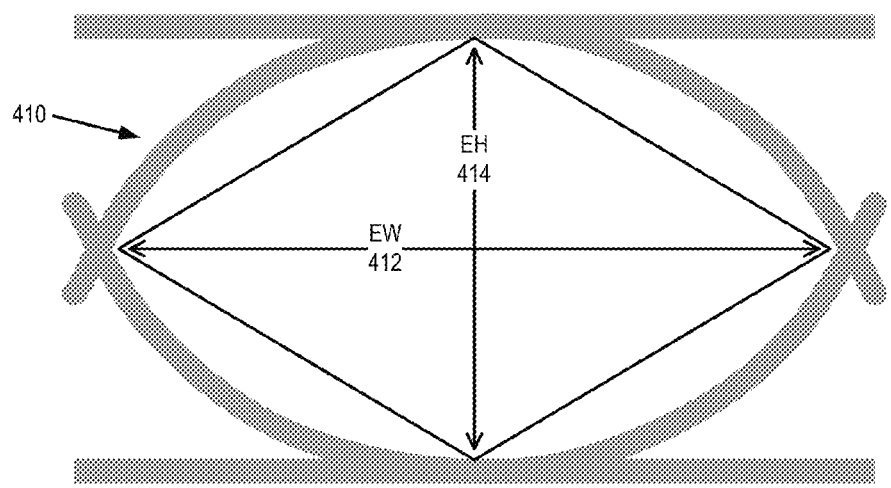
FIG. 4 is a block diagram of an embodiment of a signal eye.

FIG. 4 is a block diagram of an embodiment of a signal eye. Measuring signal eye 410 can enable a test system to margin the operation of a system under test. Signal eye 410 represents a response curve of I/O, or an input signal curve as measured by the receiver, for a specific system under test. EW (eye width) 412 can be understood as a margin for the timing domain. Thus, parameters affecting timing of the I/O circuit system would generally be understood to affect EW 412. EH (eye height) 414 can be understood as a margin for the voltage domain. Thus, parameters affecting power would generally be understood to affect EH 414. Other measurements at other angles other than 0 degrees or 90 degrees are also possible. Such measurements would include some combination of EW and EH, such as a diagonal measurement.

In one embodiment, a test system generates stress traffic and measures eye diagram or eye curve 410. EW 412 and EH 414 define how big and how good the eye is. As is understood, there is a reliability limit of what is acceptable performance for the system as indicated by the eye shape. Specifications or system ratings define threshold opening requirements for both EW 412 and EH 414.

Figure 5:
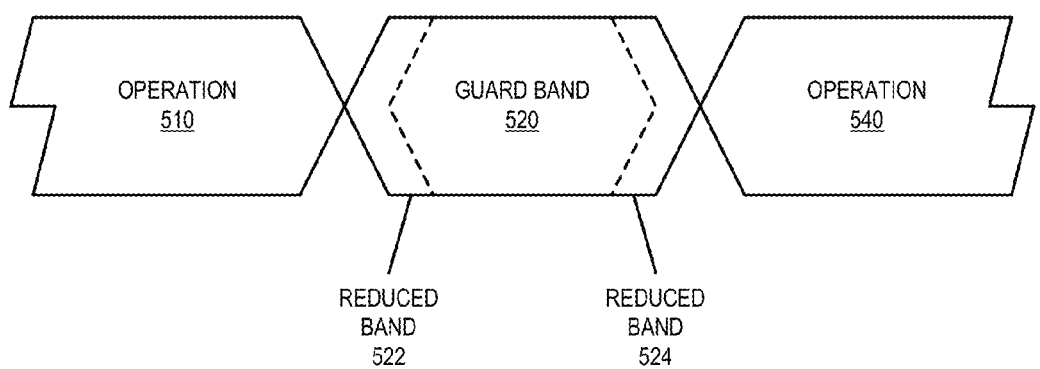
FIG. 5 is a block diagram of an embodiment of an operation or command sequence, including an indication of a reduction of guard band to operate a system at higher performance.

FIG. 5 is a block diagram of an embodiment of an operation or command sequence, including an indication of a reduction of guard band to operate a system at higher performance. Operations 510 and 540 represent any commands or data access operations that should be separated by a delay or guard band 520. Guard band 520 represents any internal delay parameter that should exist between two operations. Examples of delays between operations include, but are not limited to time between an Activate command and a column address strobe/signal (CAS), between a Precharge command and an Activate command, between an Activate command and a Read or Write command, between a Read command and data availability, between a Read command and a Precharge command, and/or others.

In one embodiment, guard band 520 can be reduced to test different settings for I/O between a memory controller and a memory device. The testing can include setting a parameter that results in operating the system with reduced guard band 520. Based on testing the performance response of the memory subsystem in response to different settings of parameters that affect the I/O performance. Based on the performance response, the system can determine what settings to use for the specific system to obtain a desired performance characteristic. Reduced band 522 represents a reduction of the guard band on the front-end, such as by initializing a guard band timer with a non-zero value. Reduced band 524 represents a reduction of the guard band on the back-end, such as by having a guard band timer reach a smaller threshold value before performing operation 540. Other ways to decrease guard band 520 will be understood by those skilled in the art.

Figure 6A:
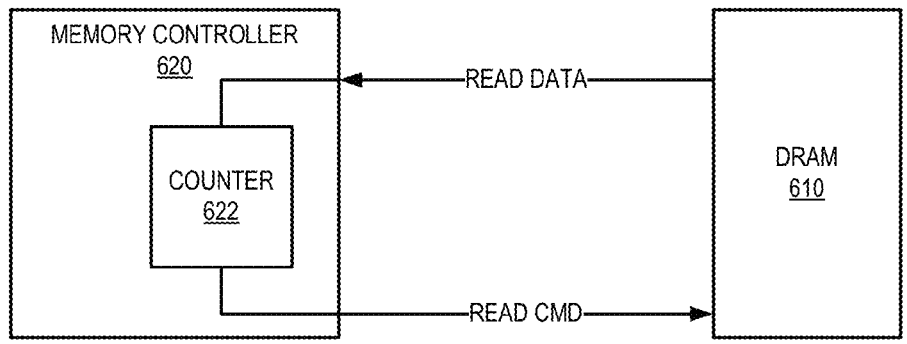
FIG. 6A is a block diagram of an embodiment of a memory controller with a counter to control I/O timing.

FIG. 6A is a block diagram of an embodiment of a memory controller with a counter to control I/O timing. System 602 represents an I/O system in accordance with any embodiment described herein. DRAM (dynamic random access memory) 610 is an example of a memory device in accordance with any embodiment described herein, and is coupled to communicate with memory controller 620. In one embodiment, memory controller 620 includes counter 622 that counts cycles for purposes of read access. Memory controller 620 generates a read command, sends the command to DRAM 610, and then waits an amount of time prior to accessing read data from the input line. Counter 622 can identify an amount of time memory controller 620 needs to wait before expecting back good data (i.e., before read data is accessible).

Traditionally counter 622 performs on a clock cycle granularity. In one embodiment, EW measurements (refer to FIG. 4) are much finer granularity than a clock cycle (e.g., cycle time divided by 64). Finer granularity enables a test system to set lower guard band parameters due to knowing more precisely how the I/O system operates. Combination of EW and operation of counter 622 provides more information than relying on counter 622 alone. In one embodiment, a test system runs tests, measures the eye, and samples the read data sooner and sooner until determining to see a count value where the quality of the signal degrades. The measurements of the signal eye can identify a specific time between two clock cycles where the signal quality degrades. Thus, the system can determine a more specific value to use for I/O.

Figure 6B:
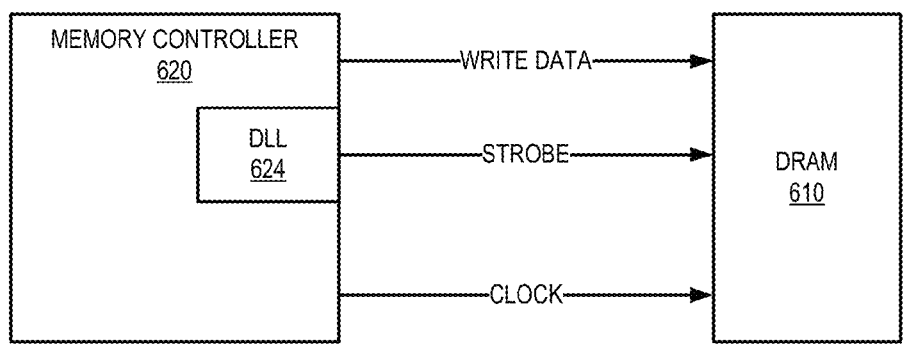
FIG. 6B is a block diagram of an embodiment of a memory controller with a delay locked loop to control I/O timing.

FIG. 6B is a block diagram of an embodiment of a memory controller with a delay locked loop to control I/O timing. System 604 represents an I/O system in accordance with any embodiment described herein. DRAM 610 is an example of a memory device in accordance with any embodiment described herein, and is coupled to communicate with memory controller 620. In one embodiment, memory controller 620 includes DLL 624 that provides programmable delay for a strobe signal (e.g., row address or column address strobes) used for write access to DRAM 610.

It will be understood that a test system can measure strobe signal timing. Based on the measurements, the test system can program delay to ensure proper timing in the data access. In one embodiment, (not specifically shown) memory controller 620 can delay the clock signal in time to adjust I/O timing. In one embodiment, memory controller 620 adjusts timing of command signals to compensate for adjusted timing parameters.

Figure 6C:
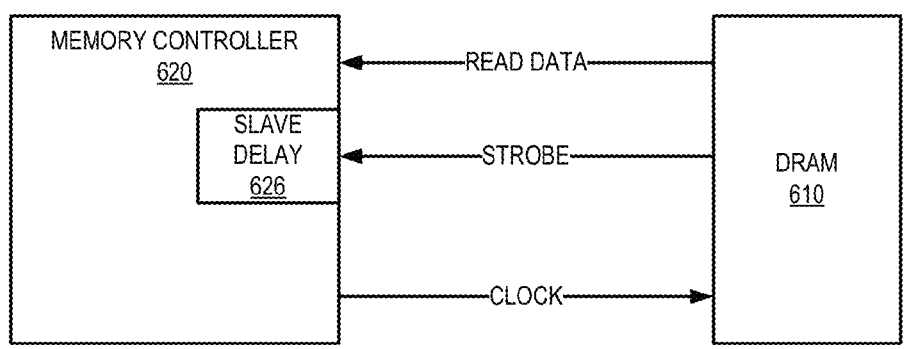
FIG. 6C is a block diagram of an embodiment of a memory controller with a slave delay circuit to control I/O timing.

FIG. 6C is a block diagram of an embodiment of a memory controller with a slave delay circuit to control I/O timing. System 606 represents an I/O system in accordance with any embodiment described herein. DRAM 610 is an example of a memory device in accordance with any embodiment described herein, and is coupled to communicate with memory controller 620. In one embodiment, memory controller 620 includes slave delay circuit 626 that provides programmable delay for a strobe signal (e.g., row address or column address strobes) used for read access to DRAM 610.

Similar to what is discussed above, a test system can measure strobe signal timing. Based on the measurements, the test system can program delay to ensure proper timing in the data access. In one embodiment, (not specifically shown) memory controller 620 can delay the clock signal in time to adjust I/O timing. In one embodiment, memory controller 620 adjusts timing of command signals to compensate for adjusted timing parameters.

Figure 7:
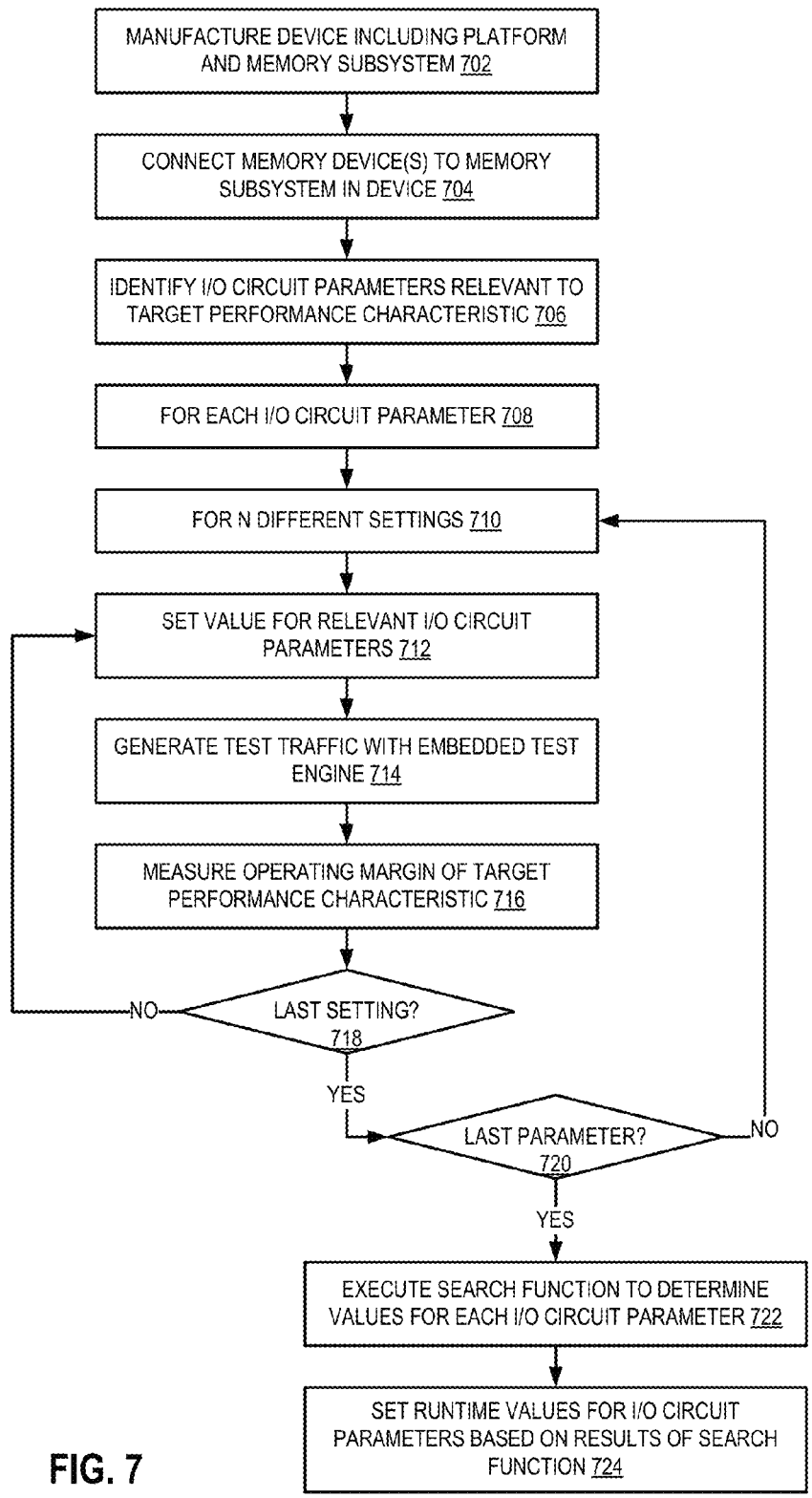
FIG. 7 is a flow diagram of an embodiment of a process for empirically testing and determining a communication setting using an exhaustive search of possible values.

FIG. 7 is a flow diagram of an embodiment of a process for empirically testing and determining a communication setting. A manufacturer manufactures a device including a host hardware platform and a memory subsystem on the platform, 702. The same or a different entity (either a manufacturer or end user) can then connect one or more memory devices to the memory subsystem in the device, 704. One or more components on the platform (e.g., such as the memory controller) will perform I/O operations with the memory device. When the system is manufactured and when the memory device(s) are connected to the memory subsystem, the individual components, such as the memory device(s), have already been tested. In one embodiment, at the point of manufacture described herein, the components are presumed to comply with standard or minimum performance expected of the components. In another embodiment, the testing discussed herein makes a system compliant, which would otherwise fail minimum performance tests.

A test engine and test system execute a test program to stress test the memory device(s) in-system to determine what settings to use for I/O circuits. The test system identifies I/O circuit parameters relevant to a target performance characteristic (e.g., power, timing), 706. The testing can be performed in accordance with any embodiment described herein. The test engine is embedded on the host platform, and does not require external test equipment to perform the testing. In one embodiment, a BIOS on the platform includes a test program or test routine to perform when memory is connected to the memory subsystem. The test program or routine directs the test engine to perform testing including measurement and analysis to determine a best setting for the specific system within the limits of what is tested. In one embodiment, the test engine is triggered from a location remote to the device including the memory device(s) to test, such as over a network connection.

In one embodiment, the test system iterates or loops through various test operations over each identified circuit parameter, 708. The test system can also loop through N different settings of any given parameter (where N is not necessarily the same for any of the number of parameters to be tested), 710. For each test iteration, the memory subsystem, at the control of the test program and/or test system, can adjust or set one or more values for relevant I/O circuit parameters, 712.

The test system generates test traffic with an embedded test engine, 714. The test content can consistent of a single or multiple tests that test for different marginalities in the design in a functional fashion at one or multiple environment conditions, such as voltage, temperature, frequency, or other conditions. The test system then measures one or more operating margins of the target performance characteristic, 716. The test system repeats the testing and measuring for each different setting until the last setting is tested, 718 YES branch. The test system iterates through each identified I/O parameter that can affect the I/O performance of interest until all parameters are tested, 720 YES branch. Until the last parameter is reached, 720 NO branch, the test engine continues iterating for each of the N different settings, 710. The test engine can use various different stress test patterns as described in more detail below, which patterns can include LFSR, victim-aggressor, crosstalk, ISI, power supply noise, power supply value, or other patterns.

The test system executes a search function to determine value for each I/O circuit parameter to use in runtime operation of the system under test, 722. The determined values should be values at which each I/O circuit parameter meets a minimum threshold for the specific system, and improves performance of at least one of the I/O circuit parameters. The test system can then cause the system under test to set runtime values for the I/O circuit parameters based on results of the search function, 724. The runtime settings can be specifically determined by the search function, or the search function can identify a value and the system can set the runtime settings just above the determine value. In one embodiment, the search function adds an explicit guard band. In one embodiment, the search function can extrapolate one or more measurements based on multiple tests or environment conditions to a worst case condition to minimize any guard band.

Figure 8:
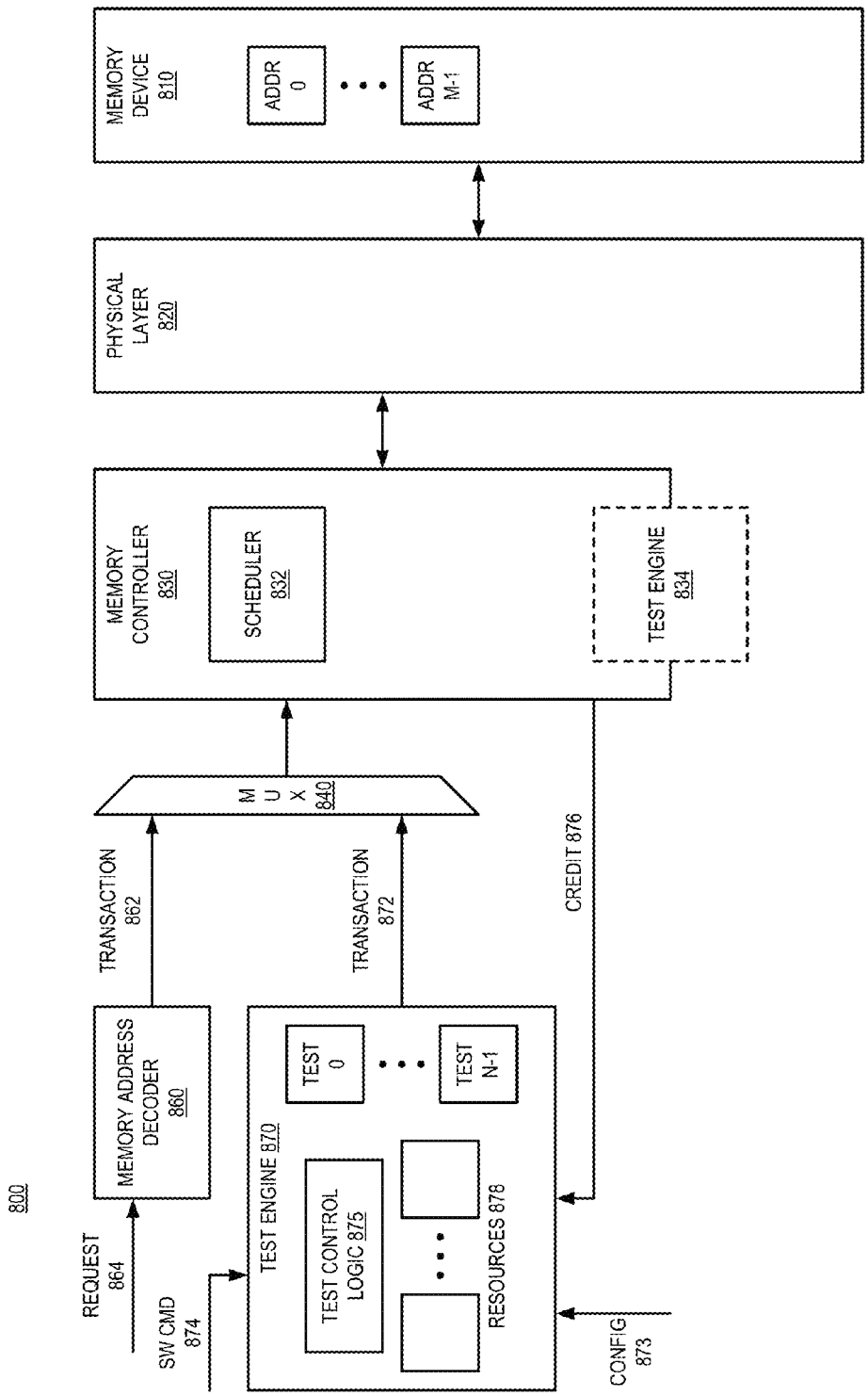
FIG. 8 is a block diagram of an embodiment of a system having a test engine with configurable hardware resources that provides transaction-level, in-system testing.

FIG. 8 is a block diagram of an embodiment of a system having a test engine with configurable hardware resources that provides transaction-level, in-system testing. System 800 is one example of an embodiment of a system with a test engine that provides in-system testing. Memory device 810 stores data and/or instructions for execution by a processor. The operation of memory device 810 is tested by a test engine (e.g., test engine 870 and/or test engine 834). As discussed herein, when a test engine detects a weak bit in memory device 810, system 800 maps out the weak bit.

Physical layer 820 provides the architecture to connect one or more memory devices 810 to memory controller 830. Physical layer 820 can include registers, interconnection lines, physical buses, and other components of a memory device that handle I/O (input/output) to/from memory device 810. In one embodiment, physical layer 820 can include components of a dual inline memory module (DIMM), which can include multiple individual DRAMs.

Memory controller 830 includes scheduler 832 to schedule (e.g., control ordering and timing of commands, implement an access protocol) memory device commands to send to memory device 810 (e.g., via physical layer 820). Memory controller 830 generates memory device commands for memory device 810 to execute. Scheduler 832 schedules the memory device commands generated in response to the memory access transactions received at memory controller 830.

Memory address decoder 860 provides a standard path for memory requests to reach memory controller 830, for example, from a host processor. Memory address decoder 860 receives request 864 from a source such as the host processor. Request 864 generally includes an access command and address information. The address can be a logical address, which does not identify the actual physical address of the memory location(s) to which the memory access is directed. Memory address decoder 860 includes logic that enables it to resolve the physical address from the virtual address information to create transaction 862. In one embodiment, transaction 862 includes a command identifier, and identifies the specific rank, bank row, and column for the command.

System 800 includes test engine 870, which receives software command 874 from a test source (for example, a BIOS device), and generates memory access transactions 872 for scheduling by memory controller 830 and execution by memory device 810. In one embodiment, transactions 872 are of the same form as transactions 862, with a command identifier (e.g., a read identifier or write identifier), and identifier for the specific rank, bank row, and column for the command. In one embodiment, memory controller 830 generates credit 876 as feedback to test engine 870. Memory controller 830 can use credit 876 to provide indicators of the timing of processing transaction 872. Thus, for example, memory controller 830 can indicate when a transaction has been processed.

In one embodiment, test engine 870 uses credit 876 to control the determinism of the testing. For example, test engine 870 can use a single credit policy in that it will only send out one transaction or command at a time. In one embodiment, test engine 870 waits to send out a subsequent transaction until memory controller 830 returns credit 876 indicating the first transaction has been issued. Thus, even if scheduler 832 uses out of order scheduling or just in time scheduling, test engine 870 can send one transaction at a time, which ensures that scheduler 832 will not reorder the test.

In one embodiment, system 800 includes multiplexer 840 or equivalent logic (e.g., logic within memory controller 830) to select between transaction 862 of memory address decoder 860 or transaction 872 of test engine 870. Although the expression "multiplexed" may be used, it will be understood that if the operation of memory address decoder is temporarily suspended, and/or higher-level operations at the processor level are suspended to prevent issuing of memory access requests, transaction 872 can be the only input available during testing. Thus, in one embodiment, mux 840 can be implemented as a simple buffer that can be written by either memory address decoder 860 or test engine 870. Alternatively, mux 840 can be a multiplexer that selects between transaction 862 and transaction 872 responsive to a set signal (not explicitly shown). Such a signal could be generated, for example, by test engine 870 or an external signal controllable by the test source. In one embodiment, such a set signal could be used as a security feature to prevent access to the test engine by malicious code that could be trying to access protected memory contents through the test engine, which it would otherwise not have access to. Thus, selecting the multiplexer can be understood in one embodiment as providing security to the test engine.

In one embodiment, test engine 870 includes dynamically configurable hardware resources 878. For example, in one embodiment, test engine 870 includes one or more configurable/programmable logic arrays or configurable logic devices controlled by test control logic 875. It will be understood that configurable/programmable logic devices can be configured via software control. As mentioned above, the software control can be through a local device, or via a remote administration device. Thus, in one embodiment, configuration (config) 873 is provided by the test source that generates software command 874. In one embodiment, configuration 873 represents a setting of one or more registers or configuration controls in test engine 870, and software logic to program test engine resources 878 can come from a storage device (not shown).

Resource 878 can be used to implement any of a number of different tests, and the configuration of the resources can be different for the different tests, although some configuration settings may overlap between tests. In one embodiment, resources 878 are arranged to implement different FSMs (finite state machines) in response to configuration 873.

Memory device 810 has memory elements (e.g., cells) with addresses ADDR0 through ADDR(M−1). The M addresses could be the range of all addresses in memory device 810, or alternatively could be a range less than the whole device over which a test sequence is to be iterated.

Test engine 870 is shown to include test0 through test (N−1). The N tests can represent different iterations through the same test (e.g., the same test transaction with N different addresses), in which case N and M could be considered equal. The N tests can represent N different tests that are each iterated through the M addresses. As illustrated, test engine 870 includes N different configurations of resources 878 to execute the N different tests. Configuration 873 is provided to configure the N different test setups of resources 878. In one embodiment, a single software command 874 operates to cause test engine 870 to generate M transaction 872 to iteratively test ADDR0 through ADDR(M−1). In one embodiment, multiple tests are generated and passed to the memory controller to be executed in parallel.

In one embodiment, the address range M can be decomposed further into {Rank[Ra-1:0], Bank[B-1:0], Row[R-1:0], Column[C-1:0]} starting and stopping addresses for a test, where the rank, bank, row, and column are understood to be of sizes Ra, B, R, and C, respectively. It will be understood that hardware can adjust the Row/Column/Bank range based on exact organization for each rank of memory device 810 (e.g., a 2 Gb DRAM will have a different number of rows than a 4 Gb DRAM). It will be understood that hardware can adjust the Rank range based on the exact system population (e.g., a system could be populated with single rank or quad rank DIMMs). In one embodiment, test engine 870 includes test control logic 875, which represents logic that enables test engine to modify its configuration based on configuration signal 873. Test control logic 875 manages the configuration of resources 878.

Test engine 870 supports use of incrementing and decrementing (negative incrementing) in sequences, by different rates and values, and across different fields or subfields. Different rates and values can apply to different ranks, rows, columns, or other address settings to generate any pattern types and test sequence. Examples can include diagonal patterns, stripes, checkerboards, programmable-sized hypercubes of a current address, or other patterns.

In one embodiment, test engine 870 is implemented in the same die space, or as an SoC (system on a chip) with the memory controller die. In one embodiment, system 800 includes test engine 834, which can perform similar functions of test engine 870, and is implemented as part of memory controller 830. In one embodiment, test engine 834 allows the testing of other aspects of system 800, such as allowing injection of test data onto the interconnections between memory controller 830 and physical layer 820. In one embodiment, test engine 834 includes a write data buffer (WDB) or other logic buffer on memory controller 830. In one embodiment, test engine 870 and/or test engine 834 is implemented as a hardware finite state machine (FSM). The test engine(s) can be dynamically programmable hardware FSMs.

In one embodiment, memory controller 830 includes one or more counters (not explicitly shown). Examples include, but are not limited by, a refresh counter, a ZQCal (impedance calculation) counter, a power down counter, or other counters. In one embodiment, test engine 870/834 performs a reset of memory controller 830 in conjunction with a memory test. The reset can include resetting one or more counters. The resetting can be performed in response to an event in memory controller 830, such as the execution of a command, or the occurrence of an alert, interrupt, error, or other condition. In one embodiment, the counters can be reset to a programmable reset value specific to a counter and/or specific to a particular test or test event.

Test engine 870 and/or test engine 834 can be used to test data lanes and/or command lanes. It will be understood that a data line or data bus is typically separate from a command/address (C/A) bus on which commands are sent from memory controller 830 to memory device 810. Similar techniques can be used to create stress traffic on the data bus, and/or the C/A bus.

In one embodiment, test engine 834 includes one or more components that enable the test system to record or log errors. The most common error would be a mismatch between data written to the memory device and a read of the written data. The recording of information can include recording address information and write information. The recorded information can include information identifying how many transactions have occurred since the start of the test (before the error occurred), a total number of errors, a number of areas for a memory region, or other information. Such information can indicate which I/O settings provide best performance for the specific system.

Figure 9B:
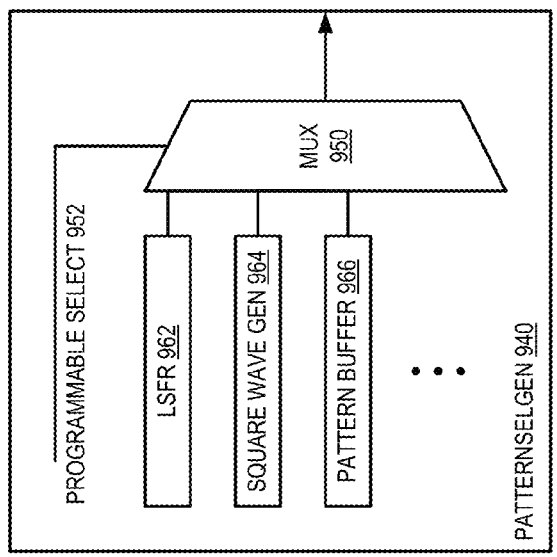
FIG. 9B is a block diagram of an embodiment of programmable pattern selection generator.
Figure 9A:
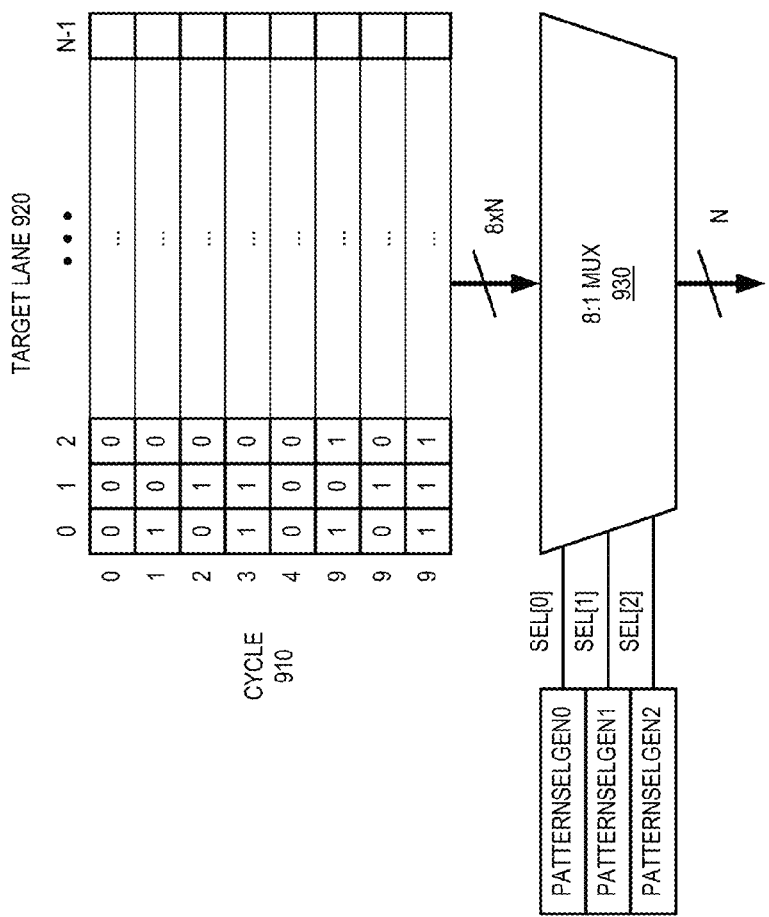
FIG. 9A is a block diagram of an embodiment of a test signal generator including a bit array selectable by pattern generators.

FIG. 9A is a block diagram of an embodiment of a test signal generator including a bit array selectable by pattern generators, which can be used to determine settings for I/O. The signal generator provides one example embodiment of a generator in accordance with any embodiment described herein. In one embodiment, the generator can be or be used with any WDB or comparable structure described herein. The generator includes a bit array of M×N bits, where M=8 in the drawing. In one embodiment, the bit array includes 32 cachelines, which assuming a burst length of 8, would mean M=8*32=256. Other values of M are possible. N is a width that provides a desired amount of storage. In one embodiment, N is a width of the data bus. As one example, N=64. Other values of N are possible. In general, it will be understood that there are numerous ways to generate write data for a memory device. The significant part is not necessarily the amount of storage space, which can be designed and/or configured based on implementation, but rather the fact that there is storage space that can be used to generate data patterns.

As illustrated, the bit array has rows representing cycle 910, or cycles of bit generation, and columns representing data lanes 920. As discussed previously, the lanes could be wider than a single bit. It will be understood that to select which cycle 910 to use, mux 930 should be triggered with a number Y of select lines where 2^Y is greater than or equal to M. Thus, three PatternSelGen blocks are shown, PatternSelGen0, PatternSelGen1, and PatternSelGen2. It will be understood that the three different PatternSelGen blocks represent different pattern selection logic. In one embodiment, the different pattern selection logic is used to produce combinations of different types of pattern logic, which produces different combinations of bits in the array. The different logic type is explained in more detail below with respect to FIG. 9B. The selection logic, PatternSelGen produces SEL[2:0] to control mux 930. Mux 930 is one embodiment of a parallel to serial mux (PISO). It will be understood that there can be other, separate PISO paths in a practical system, such as one on a command bus.

As seen, the bit array includes a simple binary sequence for columns 0-2, starting with 000 in row0, and ending with 111 in row7. Other bit array values are possible. There could also be any number of bits sequence patterns in the other columns of the bit array. The bit array structure could be used with no changes to the bits in the rows to provide M fully programmable data patterns. For example, the programmability capability could be used by training algorithms to generate fixed patterns (e.g., MPR 1010 pattern for DDR3 DIMM). In one embodiment, the bit array is used by search algorithms to attempt to find the worst case pattern by adjusting individual bits.

By adding PatternSelGen logic to Sel[2:0], the signal generation logic can operate as a lookup or truth table the encodes a specific Boolean combination of the Sel[2:0] inputs. For example, as shown in the binary sequence of columns 0-2, DQ [0] data is programmed to be 1 whenever Sel[0] is 1. Thus, DQ [0] is programmed to always output Sel[0]. Similarly, DQ[1]=Sel[1], and DQ[2]=(Sel[0] & Sel [2]). In general, such a lookup table approach allows any columns/lanes to be programmed to generate any Boolean combination of {Sel[0],Sel[1],Sel[2]}. Thus, a single PatternSelGen block can be shared by all the columns/lanes and be assigned to any given column/lane with almost no overhead logic.

FIG. 9B is a block diagram of an embodiment of programmable pattern selection generator that can be used to determine settings for I/O. PatternSelGen 940 is one example embodiment of PatternSelGen logic such as used in FIG. 9A. In one embodiment, each PatternSelGen block (e.g., 0, 1, 2) is implemented as PatternSelGen 940, with multiple different logic options for each one. In an alternative embodiment, PatternSelGen 940 is implemented in a more collective fashion rather than having all logic types repeated for each PatternSelGen. For example, PatternSelGen0, PatternSelGen1, and PatternSelGen2 could be three separate muxes 950, which each have a programmable select signal 952, and all three (or other number) multiplexers are connected to the same logic blocks. In another alternative embodiment, the output of mux 950 could be fed into multiple different logic buffers, and multiple different iterations of pattern selection can be made to generate the select signal (e.g., SEL[2:0]).

PatternSelGen 940 can have multiple different pattern options built into it, depending on the implementation of the test system. Three possible examples are illustrated: LSFR (linear shift feedback register) 962, square wave generator 964, and pattern buffer 966. Other types are possible, including types that use remapping or hashing of the address (e.g., row, column, rank, bank, output chunk count) to create patterns such as row stripes, column stripes, or checkerboards, and/or others.

LSFR 962 can generate a pseudorandom pattern with minimal hardware cost. LFSR 962 can use either a fixed or programmable polynomial, depending on implementation. In one embodiment, LFSR 962 has a fixed starting seed, and in another embodiment, LFSR 962 has a programmable starting seed. The programmable aspects can be programmed by the memory controller, or by a test system administrator system. In one embodiment, LSFR 962 is implemented on the same hardware as pattern buffer 966.

Square wave generator 964 can be a FSM (finite state machine) that will generate a digital square wave (e.g., X ones followed by Y zeros) with programmable frequency, phase shift, and duty cycle. The programmable aspects can be programmed by the memory controller, by a test system administrator system. Given that square wave generator 964 can generate a single tone frequency, can be useful at exciting resonance frequencies in the I/O system of the memory subsystem. In one embodiment, a specific resonance frequency is not known precisely. In such a case, square wave generator 964 can be programmed to increment through a range of frequencies (e.g., $f_{START}$ to $f_{STOP}$) and generate a chirp pattern. The chirp can generate a given frequency for a programmable length of time before incrementing to the next value, where the increment could be done in either a linear or exponential fashion. In one embodiment, the test system uses a square wave generator with chirp as a source of traffic.

In one embodiment, pattern buffer 966 can be a rotating shift register programmed with a fixed X-bit long pattern. Thus, the logic buffer can apply a fixed pattern to some lanes without the overhead of needing to program the entire logic buffer. In a simple case, a programmable shift register can be programmed to walk linearly through test values.

Figure 10:
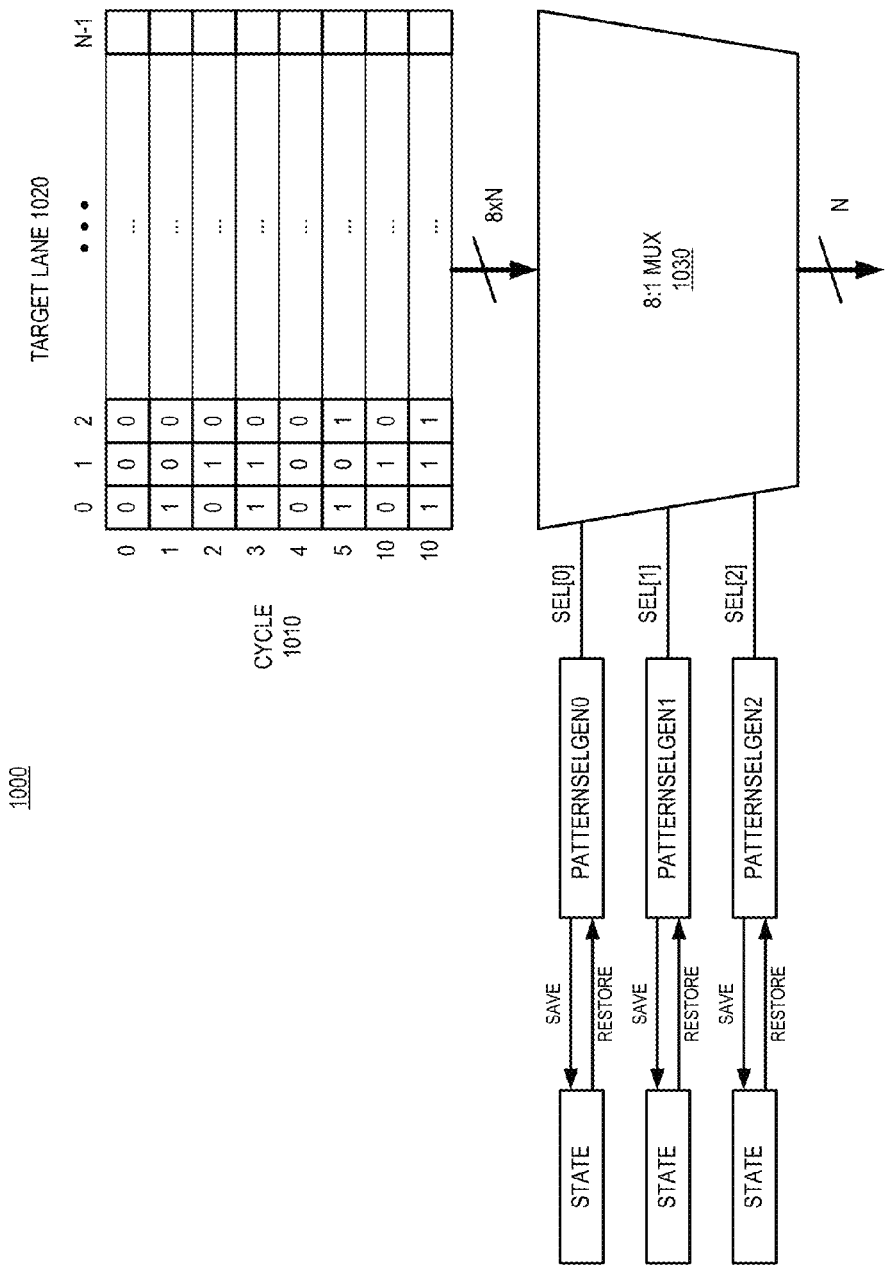
FIG. 10 is a block diagram of an embodiment of a test signal generator including a bit array selectable by pattern generators, where the pattern generators save and restore state.

FIG. 10 is a block diagram of an embodiment of a test signal generator including a bit array selectable by pattern generators, where the pattern generators save and restore state. Logic 1000 is one example of a signal generator or signal generator logic in accordance with any embodiment described herein. Similar to what is shown in FIGS. 9A and 9B, logic 1000 includes a bit array with rows, cycle 1010, and with columns, target lane 1020 (which could be either data lanes for data bus stress tests, or command lanes for command bus stress tests). Thus, as illustrated logic 1000 includes 8 rows and N columns, but there could be any number of rows needed to implement whatever testing is designed. 8:1 mux 1030 (which could alternatively be labeled as an M:1 mux), selects one of the cycles or logical combinations of cycles 1010 and outputs it, making an N-bit output to inject onto a data bus as write data.

Many classes of interesting patterns define a victim bit and a group of aggressor bits. As one possible example, suppose a test had eight data lanes, and used LFSR0 for Target[0] (victim) and LFSR1 for Target[7:1] (aggressors). Such a test could be iterated eight times, allowing each lane a chance to be a victim to achieve complete coverage. Other tests may set the victim lane to a static 1 and the aggressor lanes to 0 to create a walking one pattern. A walking zero or other similar pattern could be created in an analogous manner. As illustrated, logic 1000 includes eight cachelines of storage, and each victim-aggressor combination could use a single cacheline. Iteration of the test could be achieved by either starting/stopping the test to reprogram logic 1000, or increasing the size of the logic buffer. It will be understood that in general, logic 1000 could have a number of entries equal to (Number of Victim Lanes)*(2^Number of Sel). With a large enough bit array, the test could simply define a starting and stopping location within the blocks and how fast it should increment from one block to the next, where one block is (2^Number of Sel), and represents a single complete victim pattern.

In one embodiment, a test seeks to have each lane replay the same pattern sequence multiple times during a test, for example, to achieve uniform coverage of the test. For example, continuing the same example from above, the test could have LFSR0 and LFSR1 start with the same initial seed for each victim lane. In one embodiment, logic 1000 periodically saves and restores the PatternSelGen state to be able to replay the same pattern sequence multiple times. PatternSelGen state could include, among other things, LFSR seed value, Pattern Buffer value, and/or Square Wave Generator counter values. Thus, the PatternSelGen could have two copies of its state, both initial and current. The current state is the working copy and can be incremented, for example, during the individual transactions. In one embodiment, the initial copy is only updated by software before the test starts or during a save operation. In one embodiment, restore overrides the current state with the initial state. Likewise, a save operation can override the initial state with the current state.

Referring more specifically to logic 1000, the selection logic is expanded and more complex than what is shown above in FIG. 9A. In one embodiment, each select line (SEL[2:0]) is selected from multiple potential patterns, for example, by a multiplexer. A simpler case is illustrated for simplicity in illustration. As illustrated, each block, PatternSelGen0, PatternSelGen1, and PatternSelGen2, can save and restore state to reuse a pattern selection multiple times. A save operation stores a current state of the PatternSelGen block into an associated state storage. A restore operation reads the saved state out of the associated state storage to be applied within the PatternSelGen block. The determination to save and/or restore can be triggered in logic by test control logic, either from a memory controller, a test engine, or a remote administration source.

In one embodiment, a WDB including logic 1000 can generate both write data and expected read data. Since writes and read will occur at different times, PatternSelGen blocks should be independent between the read and write operations. Such independence allows the write PatternSelGen block to walk through a fixed sequence of traffic (e.g., LFSR increments, Pattern buffer rotations, or others), and its state is only incremented when there is write data. When a read operation is happening, logic 1000 can switch to a separate PatternSelGen block that has the same initial condition as write, and can thus replay the same pattern sequence. Such operation can ensure the expected read data will match the write data as long as the number and order of write/read transactions matches, which can be met by making such a constraint on operation of logic 1000, either through configuration or runtime programming. One option is to have separate PatternSelGen blocks for read and write. Alternatively, the PatternSelGen blocks can be shared with independent states for read or write transactions. As another alternative, the save/restore flow could be used to provide independent write versus read storage.

Returning to the example above, in one embodiment, the PatternSelGen logic is configured for a particular test or test sequence to restore state every time the cacheline increments. In one embodiment, when logic 1000 wraps back to the starting cacheline, the PatternSelGen block can skip the restore operation and replace it with a save operation. Thus, logic 1000 could perform a long test that walks through the cachelines multiple times while still making forward progress through the possible test patterns (e.g., LFSR patterns) while providing identical stress on all victim lanes.

It will be understood that logic 1000 may be implemented twice in a test system, once for tests related to data bus traffic stress, and another for tests related to command bus traffic stress. The logic could be implemented in different places within the memory subsystem to implement data stress versus command stress.

Figure 11:
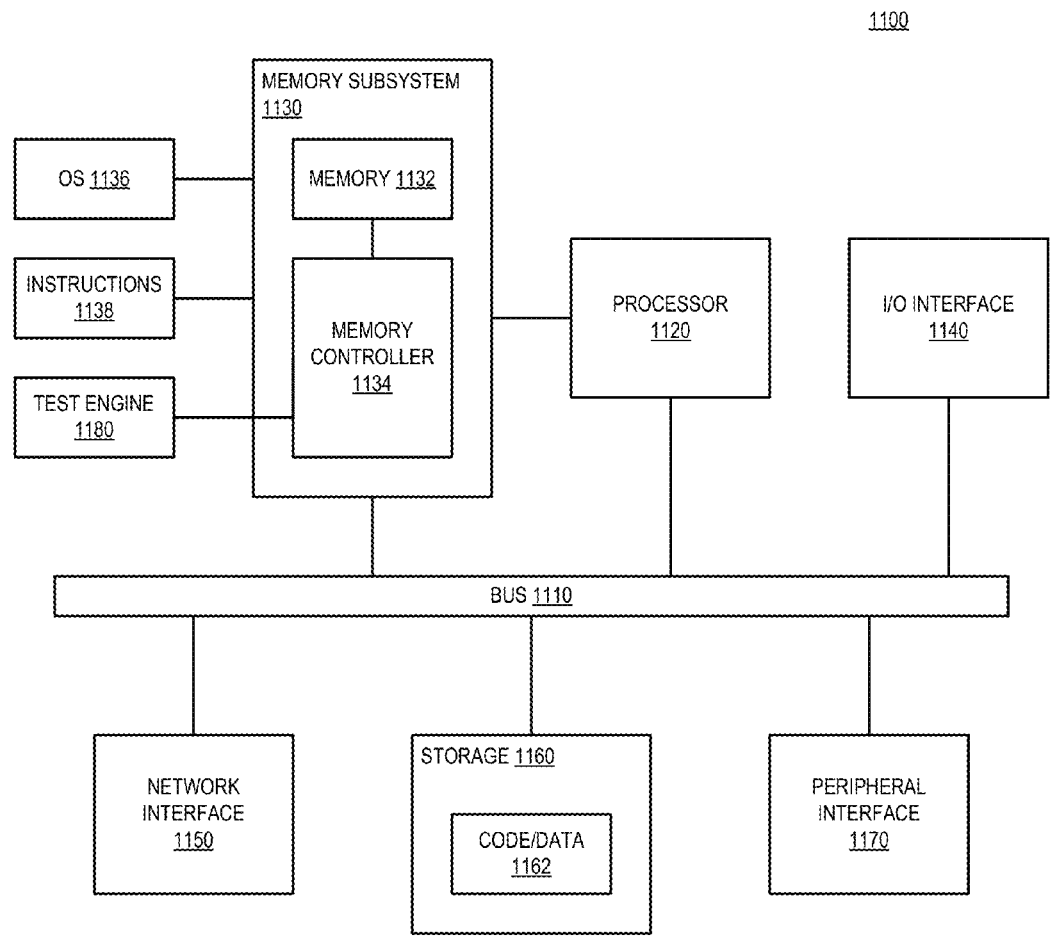
FIG. 11 is a block diagram of an embodiment of a computing system in which in-system testing can be implemented.

FIG. 11 is a block diagram of an embodiment of a computing system in which in-system testing can be implemented. System 1100 represents a computing device in accordance with any embodiment described herein, and can be a laptop computer, a desktop computer, a server, a gaming or entertainment control system, a scanner, copier, printer, routing or switching device, or other electronic device. System 1100 includes processor 1120, which provides processing, operation management, and execution of instructions for system 1100. Processor 1120 can include any type of microprocessor, central processing unit (CPU), processing core, or other processing hardware to provide processing for system 1100. Processor 1120 controls the overall operation of system 1100, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 1130 represents the main memory of system 1100, and provides temporary storage for code to be executed by processor 1120, or data values to be used in executing a routine. Memory subsystem 1130 can include one or more memory devices such as read-only memory (ROM), flash memory, one or more varieties of random access memory (RAM), or other memory devices, or a combination of such devices. Memory subsystem 1130 stores and hosts, among other things, operating system (OS) 1136 to provide a software platform for execution of instructions in system 1100. Additionally, other instructions 1138 are stored and executed from memory subsystem 1130 to provide the logic and the processing of system 1100. OS 1136 and instructions 1138 are executed by processor 1120.

Memory subsystem 1130 includes memory device 1132 where it stores data, instructions, programs, or other items. In one embodiment, memory subsystem includes memory controller 1134, which is a memory controller in accordance with any embodiment described herein, and which includes a scheduler to generate and issue commands to memory device 1132.

In one embodiment, system 1100 includes test engine 1180, which provides memory test transactions to memory controller 1134 to have memory controller 1134 schedule the transactions to provide deterministic testing. Thus, test engine 1180 enables transaction-level memory testing of memory 1132 in accordance with any embodiment described herein. The testing can be performed in-system, with the memory devices connected into a hardware platform in which they will be used in runtime. Memory subsystem 1130 can determine what settings to use for I/O between the memory controller and memory device.

Processor 1120 and memory subsystem 1130 are coupled to bus/bus system 1110. Bus 1110 is an abstraction that represents any one or more separate physical buses, communication lines/interfaces, and/or point-to-point connections, connected by appropriate bridges, adapters, and/or controllers. Therefore, bus 1110 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 1110 can also correspond to interfaces in network interface 1150.

System 1100 also includes one or more input/output (I/O) interface(s) 1140, network interface 1150, one or more internal mass storage device(s) 1160, and peripheral interface 1170 coupled to bus 1110. I/O interface 1140 can include one or more interface components through which a user interacts with system 1100 (e.g., video, audio, and/or alphanumeric interfacing). Network interface 1150 provides system 1100 the ability to communicate with remote devices (e.g., servers, other computing devices) over one or more networks. Network interface 1150 can include an Ethernet adapter, wireless interconnection components, USB (universal serial bus), or other wired or wireless standards-based or proprietary interfaces.

Storage 1160 can be or include any conventional medium for storing large amounts of data in a nonvolatile manner, such as one or more magnetic, solid state, or optical based disks, or a combination. Storage 1160 holds code or instructions and data 1162 in a persistent state (i.e., the value is retained despite interruption of power to system 1100). Storage 1160 can be generically considered to be a "memory," although memory 1130 is the executing or operating memory to provide instructions to processor 1120. Whereas storage 1160 is nonvolatile, memory 1130 can include volatile memory (i.e., the value or state of the data is indeterminate if power is interrupted to system 1100).

Peripheral interface 1170 can include any hardware interface not specifically mentioned above. Peripherals refer generally to devices that connect dependently to system 1100. A dependent connection is one where system 1100 provides the software and/or hardware platform on which operation executes, and with which a user interacts.

Figure 12:
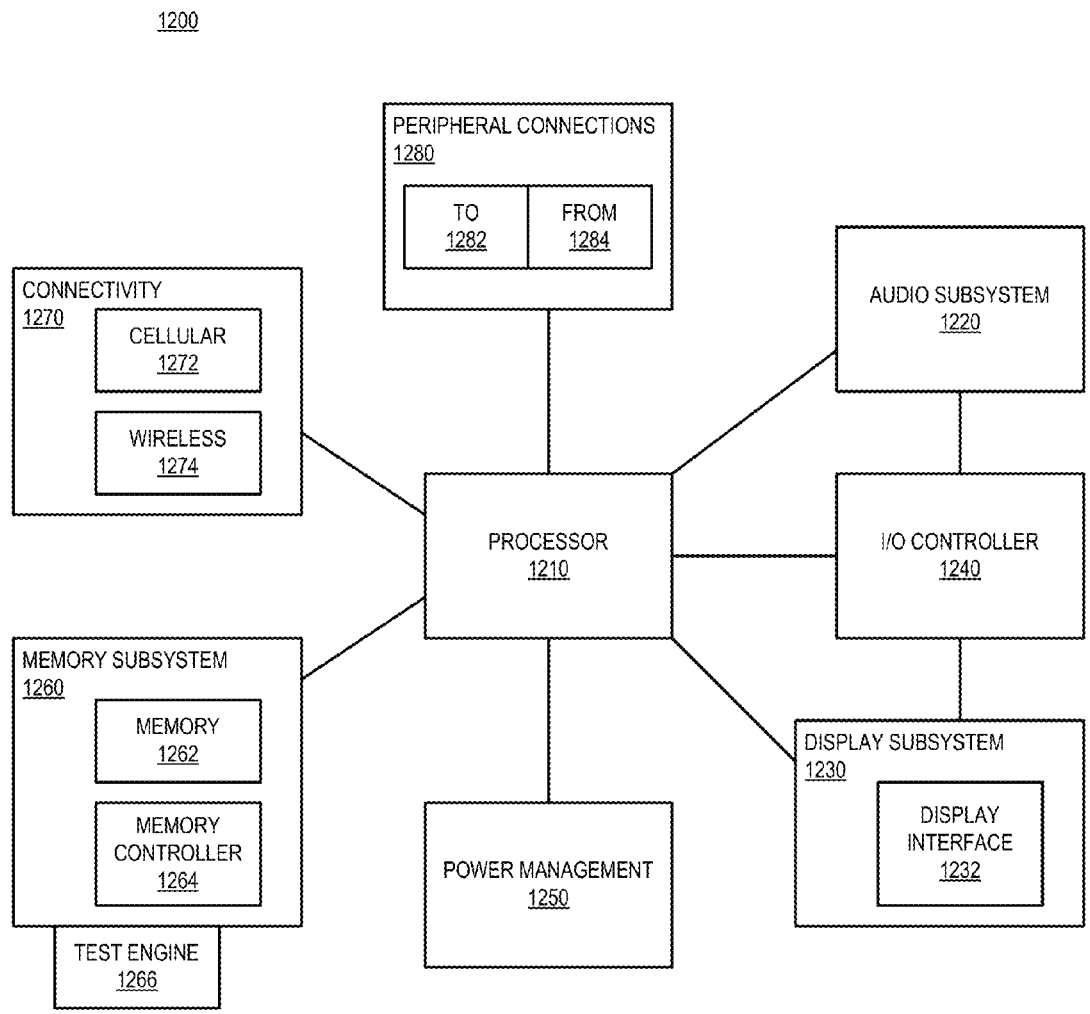
FIG. 12 is a block diagram of an embodiment of a mobile device in which in-system testing can be implemented.

FIG. 12 is a block diagram of an embodiment of a mobile device in which in-system testing can be implemented. Device 1200 represents a mobile computing device, such as a computing tablet, a mobile phone or smartphone, a wireless-enabled e-reader, or other mobile device. It will be understood that certain of the components are shown generally, and not all components of such a device are shown in device 1200.

Device 1200 includes processor 1210, which performs the primary processing operations of device 1200. Processor 1210 can include one or more physical devices, such as microprocessors, application processors, microcontrollers, programmable logic devices, or other processing means. In one embodiment, processor 1210 includes optical interface components in addition to a processor die. Thus, the processor die and photonic components are in the same package. Such a processor package can interface optically with an optical connector in accordance with any embodiment described herein.

The processing operations performed by processor 1210 include the execution of an operating platform or operating system on which applications and/or device functions are executed. The processing operations include operations related to I/O (input/output) with a human user or with other devices, operations related to power management, and/or operations related to connecting device 1200 to another device. The processing operations can also include operations related to audio I/O and/or display I/O.

In one embodiment, device 1200 includes audio subsystem 1220, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1200, or connected to device 1200. In one embodiment, a user interacts with device 1200 by providing audio commands that are received and processed by processor 1210.

Display subsystem 1230 represents hardware (e.g., display devices) and software (e.g., drivers) components that provide a visual and/or tactile display for a user to interact with the computing device. Display subsystem 1230 includes display interface 1232, which includes the particular screen or hardware device used to provide a display to a user. In one embodiment, display interface 1232 includes logic separate from processor 1210 to perform at least some processing related to the display. In one embodiment, display subsystem 1230 includes a touchscreen device that provides both output and input to a user.

I/O controller 1240 represents hardware devices and software components related to interaction with a user. I/O controller 1240 can operate to manage hardware that is part of audio subsystem 1220 and/or display subsystem 1230. Additionally, I/O controller 1240 illustrates a connection point for additional devices that connect to device 1200 through which a user might interact with the system. For example, devices that can be attached to device 1200 might include microphone devices, speaker or stereo systems, video systems or other display device, keyboard or keypad devices, or other I/O devices for use with specific applications such as card readers or other devices.

As mentioned above, I/O controller 1240 can interact with audio subsystem 1220 and/or display subsystem 1230. For example, input through a microphone or other audio device can provide input or commands for one or more applications or functions of device 1200. Additionally, audio output can be provided instead of or in addition to display output. In another example, if display subsystem includes a touchscreen, the display device also acts as an input device, which can be at least partially managed by I/O controller 1240. There can also be additional buttons or switches on device 1200 to provide I/O functions managed by I/O controller 1240.

In one embodiment, I/O controller 1240 manages devices such as accelerometers, cameras, light sensors or other environmental sensors, gyroscopes, global positioning system (GPS), or other hardware that can be included in device 1200. The input can be part of direct user interaction, as well as providing environmental input to the system to influence its operations (such as filtering for noise, adjusting displays for brightness detection, applying a flash for a camera, or other features).

In one embodiment, device 1200 includes power management 1250 that manages battery power usage, charging of the battery, and features related to power saving operation. Memory subsystem 1260 includes memory device(s) 1262 for storing information in device 1200. Memory subsystem 1260 can include nonvolatile (state does not change if power to the memory device is interrupted) and/or volatile (state is indeterminate if power to the memory device is interrupted) memory devices. Memory 1260 can store application data, user data, music, photos, documents, or other data, as well as system data (whether long-term or temporary) related to the execution of the applications and functions of system 1200.

In one embodiment, memory subsystem 1260 includes memory controller 1264 (which could also be considered part of the control of system 1200, and could potentially be considered part of processor 1210). Memory controller 1264 includes a scheduler to generate and issue commands to memory device 1262. In one embodiment, test engine 1266 is coupled to or part of memory subsystem 1260, and provides memory test transactions to memory controller 1264. The test transactions can cause memory controller 1264 to schedule the transactions to provide deterministic testing of memory device 1262. Test engine 1266 enables transaction-level memory testing in memory subsystem 1260 in accordance with any embodiment described herein. The testing can be performed in-system, with the memory devices connected into a hardware platform in which they will be used in runtime. Memory subsystem 1260 can determine what settings to use for I/O between the memory controller and memory device.

Connectivity 1270 includes hardware devices (e.g., wireless and/or wired connectors and communication hardware) and software components (e.g., drivers, protocol stacks) to enable device 1200 to communicate with external devices. The device could be separate devices, such as other computing devices, wireless access points or base stations, as well as peripherals such as headsets, printers, or other devices.

Connectivity 1270 can include multiple different types of connectivity. To generalize, device 1200 is illustrated with cellular connectivity 1272 and wireless connectivity 1274. Cellular connectivity 1272 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1274 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 1280 include hardware interfaces and connectors, as well as software components (e.g., drivers, protocol stacks) to make peripheral connections. It will be understood that device 1200 could both be a peripheral device ("to" 1282) to other computing devices, as well as have peripheral devices ("from" 1284) connected to it. Device 1200 commonly has a "docking" connector to connect to other computing devices for purposes such as managing (e.g., downloading and/or uploading, changing, synchronizing) content on device 1200. Additionally, a docking connector can allow device 1200 to connect to certain peripherals that allow device 1200 to control content output, for example, to audiovisual or other systems.

In addition to a proprietary docking connector or other proprietary connection hardware, device 1200 can make peripheral connections 1280 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a method includes receiving a host memory subsystem on a host hardware platform, the host memory subsystem including a memory device; for each of multiple different settings for multiple different I/O (input/output) circuit parameters for a target I/O performance characteristic for I/O with the memory device, setting a value for each I/O circuit parameter; generating test traffic with a test engine embedded in the host memory subsystem to stress test the memory device; and measuring an operating margin for the I/O performance characteristic; executing a search function to determine values for each I/O circuit parameter at which the operating margin meets a minimum threshold, and performance of at least one of the I/O circuit parameters is increased; and setting runtime values for the I/O circuit parameters based on the search function.

In one embodiment, the memory device comprises a DRAM (dynamic random access memory) device. In one embodiment, the target I/O performance characteristic comprises power consumption of the memory subsystem. In one embodiment, the target I/O performance characteristic comprises operating frequency of the memory subsystem. In one embodiment, the target I/O performance characteristic comprises I/O latency of the memory subsystem. In one embodiment, setting the value for the I/O circuit parameter comprises setting one of an output resistance of a transmitter, or an input resistance of a receiver. In one embodiment, setting the value for the I/O circuit parameter comprises setting a slew rate of an output driver or a value of an equalization stage. In one embodiment, setting the value of the I/O circuit parameter comprises setting a value of a turnaround time. In one embodiment, setting the value of the I/O circuit parameter comprises setting parameters of a receive circuit separately from a transmit circuit. In one embodiment, setting the value of the I/O circuit parameter comprises adjusting an operating voltage or a temperature.

In one embodiment, measuring the operating margin comprises measuring power consumption of an I/O exchange. In one embodiment, measuring the operating margin comprises measuring an eye width of an output signal curve. In one embodiment, measuring the operating margin comprises measuring an eye height of an output signal curve. In one embodiment, measuring the operating margin comprises measuring an operating frequency of the memory subsystem. In one embodiment, executing the search function comprises performing an n-dimensional search, n 1-dimensional searches, a linear fit search, a quadratic fit search, a steepest descent search, or a curve fitting search. In one embodiment, executing the search function further comprises processing one or more test results to extrapolate to a worst case condition. In one embodiment, executing the search function further comprises correlating multiple test results to compensate for noise.

In one aspect, an apparatus includes a host hardware platform including a processor; a memory subsystem on the host hardware platform including a memory device; a test system embedded in the memory subsystem to perform a search for parameter settings, including for each of multiple different settings for multiple different I/O (input/output) circuit parameters for a target I/O performance characteristic for I/O with the memory device, setting a value for each I/O circuit parameter, generating test traffic with a test engine embedded in the host memory subsystem to stress test the memory device, and measuring an operating margin for the I/O performance characteristic, and the test system further executing a search function to determine values for each I/O circuit parameter at which the operating margin meets a minimum threshold, and performance of at least one of the I/O circuit parameters is increased, and setting runtime values for the I/O circuit parameters based on the search function.

In one embodiment, the target I/O performance characteristic comprises power consumption of the memory subsystem, operating frequency of the memory subsystem, or I/O latency of the memory subsystem. In one embodiment, the test system is to set the value for the I/O circuit parameter including setting one of an output resistance of a transmitter, or an input resistance of a receiver, setting a slew rate of an output driver or a value of an equalization stage, setting a value of a turnaround time, or setting parameters of a receive circuit separately from a transmit circuit. In one embodiment, the test system is to measure the operating margin including measuring power consumption of an I/O exchange, measuring an eye width of an output signal curve, measuring an eye height of an output signal curve, or measuring frequency. In one embodiment, the test system is to execute the search function including performing an n-dimensional search, n 1-dimensional searches, a linear fit search, a quadratic fit search, a steepest descent search, or a curve fitting search.

In one embodiment, an electronic device includes a host hardware platform including a processor; a memory subsystem on the host hardware platform including a memory device; and a test system embedded in the memory subsystem to perform a search for parameter settings, including for each of multiple different settings for multiple different I/O (input/output) circuit parameters for a target I/O performance characteristic for I/O with the memory device, setting a value for each I/O circuit parameter, generating test traffic with a test engine embedded in the host memory subsystem to stress test the memory device, and measuring an operating margin for the I/O performance characteristic, and the test system further executing a search function to determine values for each I/O circuit parameter at which the operating margin meets a minimum threshold, and performance of at least one of the I/O circuit parameters is increased, and setting runtime values for the I/O circuit parameters based on the search function; and a touchscreen display coupled to generate a display based on data stored in the memory subsystem.

In one embodiment, the target I/O performance characteristic comprises power consumption of the memory subsystem, operating frequency of the memory subsystem, or I/O latency of the memory subsystem. In one embodiment, the test system is to set the value for the I/O circuit parameter including setting one of an output resistance of a transmitter, or an input resistance of a receiver, setting a slew rate of an output driver or a value of an equalization stage, setting a value of a turnaround time, or setting parameters of a receive circuit separately from a transmit circuit. In one embodiment, the test system is to measure the operating margin including measuring power consumption of an I/O exchange, measuring an eye width of an output signal curve, measuring an eye height of an output signal curve, or measuring frequency. In one embodiment, the test system is to execute the search function including performing an n-dimensional search, n 1-dimensional searches, a linear fit search, a quadratic fit search, a steepest descent search, or a curve fitting search.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
  receiving a host memory subsystem on a host hardware platform, the host memory subsystem including a memory device;
  establishing respective settings for each of multiple different I/O (input/output) circuit parameters for a target I/O performance characteristic for communication with the memory device by performing the following:
    setting a respective value for each I/O circuit parameter;
    generating test traffic with a test engine embedded in the host memory subsystem to stress test the memory device; and
    measuring an operating margin for the I/O performance characteristic;
    repeating the setting, generating and measuring for different values of at least one of the I/O circuit parameters so that a plurality of measurements for different I/O circuit parameter settings is made;

executing a search function to determine values for each I/O circuit parameter at which the operating margin meets a minimum threshold, wherein the search function extrapolates from the plurality of measurements to a worst case condition; and setting runtime values for the I/O circuit parameters based on the execution of the search function.

2. The method of claim 1, wherein the memory device comprises a DRAM (dynamic random access memory) device.

3. The method of claim 1, wherein the target I/O performance characteristic comprises:
power consumption of the memory subsystem.

4. The method of claim 1, wherein the target I/O performance characteristic comprises:
operating frequency of the memory subsystem.

5. The method of claim 1, wherein the target I/O performance characteristic comprises:
I/O latency of the memory subsystem.

6. The method of claim 1, wherein setting the value for the I/O circuit parameter comprises:
setting one of an output resistance of a transmitter, or an input resistance of a receiver.

7. The method of claim 1, wherein setting the value for the I/O circuit parameter comprises:
setting a slew rate of an output driver or a value of an equalization stage.

8. The method of claim 1, wherein setting the value of the I/O circuit parameter comprises:
setting a value of a turnaround time.

9. The method of claim 1, wherein setting the value of the I/O circuit parameter comprises:
setting parameters of a receive circuit separately from a transmit circuit.

10. The method of claim 1, wherein setting the value of the I/O circuit parameter comprises:
adjusting an operating voltage or a temperature.

11. The method of claim 1, wherein measuring the operating margin comprises:
measuring power consumption of an I/O exchange.

12. The method of claim 1, wherein measuring the operating margin comprises:
measuring an eye width of an output signal curve.

13. The method of claim 1, wherein measuring the operating margin comprises:
measuring an eye height of an output signal curve.

14. The method of claim 1, wherein measuring the operating margin comprises:
measuring an operating frequency of the memory subsystem.

15. The method of claim 1, wherein executing the search function comprises:
performing an n-dimensional search, n 1-dimensional searches, a linear fit search, a quadratic fit search, a steepest descent search, or a curve fitting search.

16. The method of claim 1, wherein executing the search function further comprises:
correlating multiple test results to compensate for noise.

17. An apparatus comprising:
a host hardware platform including a processor;
a test system embedded in a memory controller to perform a search for parameter settings for a memory device, including to establish respective settings for each of multiple different I/O (input/output) circuit parameters for a target I/O performance characteristic for I/O with the memory device:

set a value for each I/O circuit parameter, generate test traffic with a test engine embedded in the memory controller to stress test the memory device, and measure an operating margin for the I/O performance characteristic, repeatedly set a new value for at least one of the I/O circuit parameters and generate test traffic with the test engine to repeatedly stress test the memory device so that a plurality of measurements with different I/O circuit parameters is made;

execute a search function to determine values for each I/O circuit parameter at which the operating margin meets a minimum threshold, wherein, the search function is to extrapolate from the plurality of measurements to a worst case condition, and set runtime values for the I/O circuit parameters based on the execution of the search function.

18. The apparatus of claim 17, wherein the target I/O performance characteristic comprises:
power consumption of a memory subsystem that includes the memory controller and the memory device, operating frequency of the memory subsystem, or I/O latency of the memory subsystem.

19. The apparatus of claim 17, wherein the test system is to set the value for the I/O circuit parameter including
set one of an output resistance of a transmitter, or an input resistance of a receiver, set a slew rate of an output driver or a value of an equalization stage, set a value of a turnaround time, or set parameters of a receive circuit separately from a transmit circuit.

20. The apparatus of claim 17, wherein the test system is to measure the operating margin including
measure power consumption of an I/O exchange, measure an eye width of an output signal curve, measure an eye height of an output signal curve, or measure frequency.

21. The apparatus of claim 17, wherein the test system is to execute the search function including
perform an n-dimensional search, n 1-dimensional searches, a linear fit search, a quadratic fit search, a steepest descent search, or a curve fitting search.

22. An electronic device comprising:
a host hardware platform including a processor;
a memory subsystem on the host hardware platform including a memory controller and a memory device; and
a test system embedded in the memory subsystem to perform a search for parameter settings, including to establish respective settings for each of multiple different I/O (input/output) circuit parameters for a target I/O performance characteristic for I/O with the memory device:

set a value for each I/O circuit parameter, generate test traffic with a test engine embedded in the memory controller to stress test the memory device, and measure an operating margin for the I/O performance characteristic, and repeatedly set a new value for at least one of the I/O circuit parameters and generate test traffic with the test engine to repeatedly stress test the memory device so that a plurality of measurements with different I/O circuit parameters is made;

execute a search function to determine values for each I/O circuit parameter at which the operating margin meets a minimum threshold, and performance of at least one of the I/O circuit parameters is increased, wherein, the search function is to extrapolate from the plurality of measurements to a worst case condition, and set runtime values for the I/O circuit parameters based on the execution of the search function.

23. The electronic device of claim 22, wherein the target I/O performance characteristic comprises:

power consumption of the memory subsystem, operating frequency of the memory subsystem, or I/O latency of the memory subsystem.

* * * * *